(12) United States Patent
Awano

(10) Patent No.: US 6,885,041 B2
(45) Date of Patent: Apr. 26, 2005

(54) SEMICONDUCTOR DEVICE, METHOD FOR FABRICATING THE SEMICONDUCTOR DEVICE AND SEMICONDUCTOR INTEGRATED CIRCUIT

(75) Inventor: Yuji Awano, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 122 days.

(21) Appl. No.: 10/307,470

(22) Filed: Dec. 2, 2002

(65) Prior Publication Data

US 2003/0094637 A1 May 22, 2003

Related U.S. Application Data

(62) Division of application No. 09/794,012, filed on Feb. 28, 2001, now Pat. No. 6,509,586.

(30) Foreign Application Priority Data

Mar. 31, 2000 (JP) .......................................... 2000-98588
May 2, 2000 (JP) ....................................... 2000-133536

(51) Int. Cl.$^7$ .......................................... H01L 31/0328
(52) U.S. Cl. ...................... 257/192; 257/327; 257/340; 257/401; 257/616
(58) Field of Search ............................... 257/192, 327, 257/329, 340, 347, 401, 616

(56) References Cited

U.S. PATENT DOCUMENTS

| | | | |
|---|---|---|---|
| 4,885,614 A | 12/1989 | Furukawa et al. | 257/183 |
| 5,914,504 A | 6/1999 | Augusto | 257/192 |
| 5,965,914 A | * 10/1999 | Miyamoto | 257/331 |
| 6,064,081 A | 5/2000 | Robinson et al. | 257/183 |
| 6,143,593 A | 11/2000 | Augusto | 438/199 |
| 6,278,165 B1 | 8/2001 | Oowaki et al. | 257/288 |

FOREIGN PATENT DOCUMENTS

JP 11-284171 10/1999

OTHER PUBLICATIONS

J.M. Hergenrother et al., *IEDM Tech. Gig.*, p. 75, Sep. 1999.

M. Koyanagi et al., *IEEE Micro 18* (4) 17, 1998, Jul.–Aug.

M. Ohfuti et al., *Extended Abstracts of the 1999 International Conference on Solid State Device and Materials*, Tokyo, 1999, pp. 476–477.

* cited by examiner

*Primary Examiner*—Tom Thomas
*Assistant Examiner*—N. Drew Richards
(74) *Attorney, Agent, or Firm*—Westerman, Hattori, Daniels & Adrian LLP

(57) ABSTRACT

A semiconductor device comprises: a channel region 14 of silicon, a source region 26 and a drain region 26 respectively forming junction with the channel region 14, and a gate electrode 30 formed on the channel region 14 interposing an insulation film 16 therebetween, either of the source region 26 and the drain region 26 being formed of SiGeC, which lattice-matches with silicon. Whereby parasitic resistance between the source region and the drain region can be much decreased.

2 Claims, 31 Drawing Sheets

SEMICONDUCTOR DEVICE, METHOD FOR FABRICATING THE SEMICONDUCTOR DEVICE AND SEMICONDUCTOR INTEGRATED CIRCUIT

This application is a division of application Ser. No. 09/794,012, filed Feb. 28, 2001, now U.S. Pat. No. 6,509,586.

BACKGROUND OF THE INVENTION

The present invention relates to a semiconductor device of a MIS (Metal-Insulator-Semiconductor) structure and a method for fabricating the same, more specifically to a semiconductor device and a method for fabricating the same which can decrease parasitic resistance and improve current-driving performance.

The present invention also relates to a semiconductor device of semiconductor-semimetal structures, and a semiconductor integrated circuit including a plurality of the semiconductor integrated structures laid one on another through inter-layer insulation films.

Semiconductor devices require higher integration and higher speed for further improved performances. To meet such requirements, micronization of constituent elements is essential. Not only micronizing techniques, but also various structures and their fabrication methods for attaining high operation speed of the elements are proposed.

In a transistor of MIS (Metal-Insulator-Semiconductor) structure, which represents MOSFET (Metal Oxide Semiconductor Field Effect Transistor), the element is micronized mainly by decreasing the gate length.

However, as the MOSFET is more micronized, the influence of the drain electric field to the channel region become unignorable, and the phenomena that a threshold voltage rapidly changes with respect to a gate length, the so-called short channel effect becomes a problem. Generation of the short channel effect causes threshold voltage deviation of an ultra-micronized MOSFET, which substantially decreases margins of circuit designs. In addition, with the element micronization, the dopant diffused layer has become extremely shallow. The parasitic resistance component in the source/drain region is a barrier to improving the current-driving performance.

Accordingly, to develop elements, it is very important to suppress the short channel effect accompanying the element niicronizatiou and decrease the parasitic resistance.

FIG. 29 shows a diagrammatic sectional view of the typical MIS-type semiconductor device. An SOI substrate is formed of a silicon substrate 200, a silicon oxide film 202 formed on the silicon substrate 200, and a silicon layer 204 formed on the silicon oxide film 202. A gate electrode 208 is formed on the silicon layer 204 interposing a gate insulation film 206 therebetween. A source/drain diffused layers 210 are formed in the silicon layer 204 on both sides of the gate electrode 208. The source/drain diffused layers 210 have respective extension regions 214 directed to a channel region 212, which is immediately below the gate electrode 208.

The semiconductor device shown in FIG. 29 suppress the short channel effect by using the SOI substrate and providing the extension regions 214 in the source/drain diffused layers 210. The extension regions 214 have higher dopant concentration than the lightly doped diffused region of the conventional LDD (Lightly Doped Drain) structure, whereby the source/drain diffused layers 210 has reduced parasitic resistance. However, as the micronization further goes on, even in the semiconductor device shown in FIG. 29 the parasitic resistance of the source/drain diffused layers will be a barrier factor for improving current-driving performance. This structure is approaching to the limit in terms of processing techniques because further micronization requires the source/drain diffused layers 210 to have abrupt profile.

On the other hand, it is theoretically presumed that SiGeC semiconductor material, which lattice-matches with the silicon substrate, has the band gap narrowed by increasing a carbon (C) concentration and, furthermore, semimetalized (refer to, e.g., M. Ohfuti et al., Extended Abstracts of the 1999 International Conference on Solid State Device and Materials, Tokyo, 1999, pp. 476–477). Then, it is proposed that such semimetalized layer is used in the so-called elevated source/drain structure so as to decrease parasitic resistance (refer to, e.g., Laid-open Japanese Patent Application No. Hei 11-284174, 1999). As exemplified in FIG. 30, in a semiconductor device having an elevated source/drain structure, a semimetal layer 216 of an SiGeC layer is formed on a silicon layer 204 of the source/drain regions. However, in this structure, the semimetal layer 216 is formed across a sidewall insulation film 218 on the side wall of the gate electrode 208, whereby resistance between a channel region 212 immediately below the gate electrode 208 and the semimetal layer 216 cannot be decreased.

Tucker et al. propose a Schottky junction Source/drain structure using a metal layer as the extension regions for the end of decreasing the parasitic resistance in source/drain regions. As shown in FIG. 31A, a semiconductor device having the Schottky junction source/drain structure has the source/drain regions formed of a metal layer 220 which is extended down to a channel region 212 immediately below the gate electrode 208. However, in this structure, potential barrier is formed due to the semiconductor-metal junction (Schottky junction) formed between the channel region 212 and the source/drain regions 220, whereby the potential in the channel region increases, and excess resistance is generated. This structure cannot be absolutely good for improving current-driving performance. It is also a disadvantage that in order to nullify the potential, an offset voltage is needed until current starts to flow.

As described above, various structures have been proposed so as to decrease the parasitic resistance in the source/drain regions. However, these structures cannot be sufficient to improve current-driving performance. A semiconductor device which can decrease the parasitic resistance in the source/drain diffused layer regions and further improve current-driving performance has been required.

On the other hand, semiconductor integrated circuits have so far continuously increased integration by scale-down of dimensions and break-through of device structures. However, the micronization of transistors has come to the stage of sub-0.1 micron size, and it has come almost to a limit to maintain the scaling. The limit is conspicuous specifically in processing techniques which cause characteristic deflections, such as gate length deflections, dopant deflections, etc., and in thinning ion-doped layers. Furthermore, it is difficult to continue the micronizing trend, e.g., maintain cell size factors of DRAMs and others as far as the micronization trend relies on the conventional planar device structure.

Presently, for further micronization, the so-called vertical MOS transistor has begun to be proposed (refer to. e.g., J. M. Hergenrother et al., IEDM Tech., Dig., p. 75, 1999).

However, a transistor simply formed in a vertical structure can have a decreased gate length but must have a large heavily doped semiconductor region in a lead part from the lower region of the gate electrode to the source/drain electrodes. This causes a problem that parasitic resistance component in this region is a cause for deteriorating high speed and high frequency characteristics of the transistor.

Furthermore, micronizing elements, retaining their high performances is required not only by simple MOS transistors, but also naturally by semiconductor devices of complicated constitutions including a plurality of transistors having different conduction types, dopant concentrations, etc. connected to one another. Further improvement and development of transistor structures are presently waited.

Higher density of integrated circuits and higher integration and higher performances of systems on chips, etc. are required, and multi-layer interconnection techniques and furthermore three-dimensional integration are being studied (refer to, e.g., M. Koyanagi et al., IEEE MICRO 18(4), p.17, 1998).

As exemplified in FIG. 32, such integrated circuit comprises LSI chips 301 formed in semiconductor integrated structures, which are arranged in multi-layers one on another with inter-layer insulation films 302 respectively disposed between the respective LSI chips 301 and their adjacent one, and are connected to their adjacent one by metal columns 303 called vias buried in the inter-layer insulation films 302.

As semiconductor integrated circuits are more complicated in such multi-layer structures, it is more required to more integrate and more micronize the semiconductor integrated circuits with their high performances retained. Their design freedom is accordingly more required.

SUMMARY OF THE INVENTION

A first object of the present invention is to provide a structure of a semiconductor device and a method for fabricating the same which can decrease the parasitic resistance of the source/drain regions and can improve current-driving performance.

A second object of the present invention is to provide a semiconductor device which allows various elements of complicated constitutions having a plurality of different transistors interconnected to one another to be integrated with high density in much reduced occupation areas in comparison with those of planar-type element structures, retaining good high-speed and high-frequency characteristics.

A third object of the present invention is to provide a semiconductor integrated circuit of a complicated multi-layer interconnected constitution including a plurality of integrated circuit structures laid one on another with inter-layer insulation films disposed therebetween, in which vias interconnecting the laid semiconductor integrated structures are given prescribed functions to be used so as to ensure organic interrelation among the respective semiconductor integrated structures in small occupation areas and with very high efficiency and to drastically improve design freedom.

The above-described first object is achieved by a semiconductor device comprising: a channel region formed of silicon; a source region and a drain region respectively forming junction with the channel region; and a gate electrode formed on the channel region interposing an insulation film therebetween, at least one of the source region and the drain region being formed of SiGeC, which lattice-matches with silicon.

In the above-described semiconductor device, it is possible that a junction between the channel region and the source region or the drain region is formed immediately below the gate electrode or the ends of the gate electrode.

In the above-described semiconductor device, it is possible that the gate electrode is formed surrounding the channel region.

In the above-described semiconductor device, it is possible that the gate electrode includes a lower gate electrode and an upper gate electrode, and the low gate electrode and the upper gate electrode are formed, opposed to each other across the channel region.

In the above-described semiconductor device, it is possible that the source region or the drain region is formed of a semimetallic SiGeC containing carbon by above 6%.

The above-described first object also is achieved by a method for fabricating a semiconductor device comprising the steps of: forming a channel region of silicon; and forming a source region or a drain region of SiGeC to respectively form junction with the channel region.

In the above-described semiconductor device, it is possible that the method further comprises, prior to the step of forming the channel region, the steps of: forming a gate insulation film on a substrate having a single crystal layer at least on the surface thereof; and forming a first electrode on the gate insulation film, in the step forming the channel region, the gate insulation film and the silicon layer are etched with the first electrode as a mask to form the channel region of the silicon layer below the gate electrode; and in the step of forming the source region or the drain region, the source region and/or the drain region are epitaxially grown with the channel region as a seed.

In the above-described semiconductor device, it is possible that the method further comprises the steps of: removing the first electrode; and burying a gap formed by removing the first electrode with a second electrode.

In the above-described semiconductor device, it is possible that the method further comprises, prior to the step of forming the channel region, the steps of: forming a gate insulation film on a substrate having a single crystal layer at least on the surface thereof; and forming a gate electrode on the gate insulation film, selectively transforming the silicon layer in regions on both sides of the gate electrode to SiGeC to form the source region and/or the drain region and form the channel region of the silicon layer between the source region and the drain region.

In the above-described semiconductor device, it is possible that the method further comprises, prior to the step of forming the channel region, the steps of: sequentially forming on a silicon substrate, a first gate electrode, a first gate insulation film, a film-to-be-selectively-removed having etching characteristics different from those of the first gate insulation film, a second gate insulation film having etching characteristics substantially equal to those of the first gate insulation film, and a second gate electrode; selectively removing the film-to-be-selectively-removed; and epitaxially growing a silicon layer with the silicon substrate as a seed to bury a gap between the first gate insulation film and the second gate insulation film with the silicon film, in the step of forming the channel region, the silicon layer being left selectively between the first gate insulation film and the second gate insulation film to form the channel region of the silicon layer, and in the step of forming the source region and/or the drain region, the source region and/or the drain region being epitaxially grown with the channel region as a seed.

The above-described first object also is achieved by a method for fabricating a semiconductor device comprising the steps of: forming on a silicon substrate an insulation film with an opening reaching the silicon substrate; forming a film-to-be-selectively-removed having etching characteristics different from those of the first insulation film on the insulation film and in the opening; forming a gate electrode on the film-to-be-selectively removed interposing a gate insulation film therebetween; removing the film-to-be-selectively-removed; and epitaxially growing, with the silicon substrate exposed in the opening as a seed, continuously a source region of SiGeC, a channel region of silicon forming junction with the source region and a drain region forming junction with the channel region.

The above-described first object is also achieved by a method for fabricating a semiconductor device comprising the steps of: epitaxially growing on a substrate having a single crystal silicon layer at least on the surface thereof, continuously a source region of SiGeC, a channel region of silicon forming junction with the source region, and a drain region forming junction with the channel region; forming a gate insulation film, surrounding the channel region; and forming a gate electrode surrounding the channel region interposing the gate insulation film therebetween.

In the semiconductor device according to the present invention comprising the channel region of silicon, the source region and the drain region respectively forming a junction with the channel region, the gate electrode formed on the channel region interposing the insulation film therebetween, at least one of the source region and the drain regions is formed of SiGeC, which lattice-matches with silicon, whereby parasitic resistance in the region can be reduced because of a number of carriers of the semimetallic SiGeC.

The composition graded layer is provided between the channel region and the source/drain regions, whereby potential changes in the junction interface can be smooth, and the parasitic resistance can be further reduced.

Accordingly, the semiconductor device according to the present invention can provide a high-speed, high-frequency MOS transistor having no potential barrier between the source region and the channel region and between the drain region and the channel region, and having abrupt doping profile provided by the crystal growth.

The second object of the present invention is achieved by a semiconductor device comprising: a layered structure including: a first semimetal layer; a first semiconductor layer formed on the first semimetal layer; a second semimetal layer formed on the first semiconductor layer; a second semiconductor layer formed on the second semimetal layer; and a third semimetal layer formed on the second semiconductor layer; a first gate electrode for controlling a current between the first semimetal layer and the second semimetal layer through the first semiconductor layer; and a second gate electrode for controlling a current between the second semimetal layer and the third semimetal layer through the second semiconductor layer, the first semiconductor layer and the second semiconductor layer having substantially the same lattice constant as the first to the third semimetal layers or being thin sufficiently to prevent occurrence of crystal defects even when a lattice constant disagree with the first to the second semimetal layers.

The semiconductor device has as a basic structure the semiconductor-semimetal structure comprising a semiconductor layer which is thin sufficiently to prevent occurrence of crystal defects even when a lattice constant agrees or does not agree, a first semimetal layer and a second semimetal layer, the semiconductor layer being sandwiched between the first and the second semimetal layers, the semiconductor layer forming a gate electrode, and the first and the second semimetal layers forming the ohmic electrodes. At least two basic structures are laid one on another to form a required semiconductor device, such as a vertical complementary MOS inverter structure, a vertical transmission gate structure, an E/D logic gate structure, or others.

Thus, the semiconductor device according to the present invention comprises the basic structures laid three-dimensionally one on another, whereby the semiconductor device can be provided in a layer structure in which a plurality of transistors of good high-speed and high-frequency characteristics complicatedly interconnected in a relatively simple layer structure and in a very small occupied area which does not much add to an occupied area of one basic structure.

According to the present invention, various elements of complicated structures including a plurality of different transistors interconnected to one another can have much decreased occupied areas and higher integration with higher density in comparison with the planar element structures, maintaining good high-speed and high-frequency characteristics.

The third object of the present invention is achieved by a semiconductor integrated circuit including a plurality of semiconductor integrated structures laid one on another interposing inter-layer insulation films therebetween, comprising: a via buried in the inter-layer insulation film for electrically connecting the different semiconductor integrated circuit structures, the via having a first semimetal layer; a second semimetal layer; a semiconductor layer having substantially the same lattice constant as the first and the second semimetal layer or being thin sufficiently to prevent occurrence of crystal defects even when a lattice constant disagree with the first and the second semimetal layer, the semiconductor layer being sandwiched between the first and the second semimetal layers; and a gate electrode for controlling a current between the first semimetal layer and the second semimetal layer through the semiconductor layer.

The semiconductor integrated circuit of the present invention is an integrated circuit in which a plurality of semiconductor integrated structures are laid one on another through inter-layer insulation films. In the integrated circuit, vias buried in the inter-layer insulation films and electrically connecting the different semiconductor integrated structures provide the basic structures.

In the semiconductor integrated circuit according to the present invention, the basic structure of the transistor is applied to the vias electrically interconnecting the semiconductor integrated structures, whereby the vias can be used not only the mere connection means, but also as the elements having various positive functions in addition to the connection function, e.g., switching function.

According to the present invention, an integrated circuit of a complicated multi-layer interconnection structure including a plurality of semiconductor integrated structures laid one on another through inter-layer insulation films can ensure organic relationship among the respective semiconductor integrated structures very effectively at a small occupied area and drastically increase design freedom by using vias interconnecting semiconductor integrated structures laid one on another and giving prescribed functions to the vias.

DETAILED DESCRIPTION OF THE INVENTION

[A First Embodiment]

A semiconductor device and a method for fabricating the same according to a first embodiment of the present invention will be explained with reference to FIGS. 1, 2A–2B, 3, 4A–4C, and 5A–5C.

Figure 1:
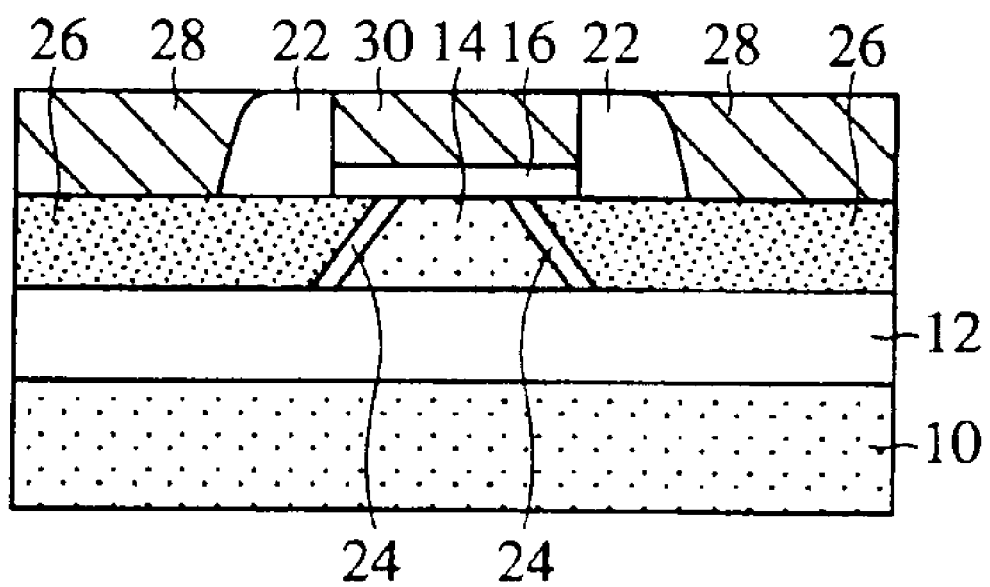
FIG. 1 is a diagrammatic sectional view of the semiconductor device according to a first embodiment of the present invention, which shows a structure thereof.
Figure 2A:
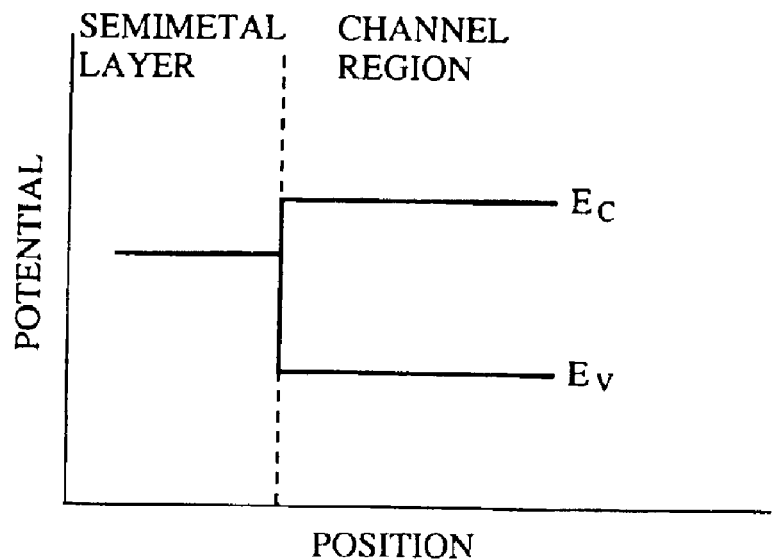
FIGS. 2A and 2B are graphs of energy band structures at the interface between the channel region and the source/drain region of the semiconductor device according to the first embodiment of the present invention.
Figure 2B:
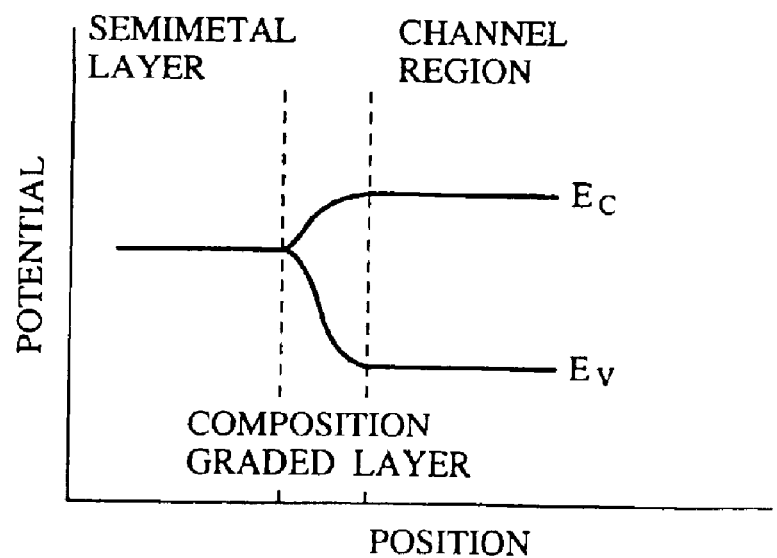
Figure 3:
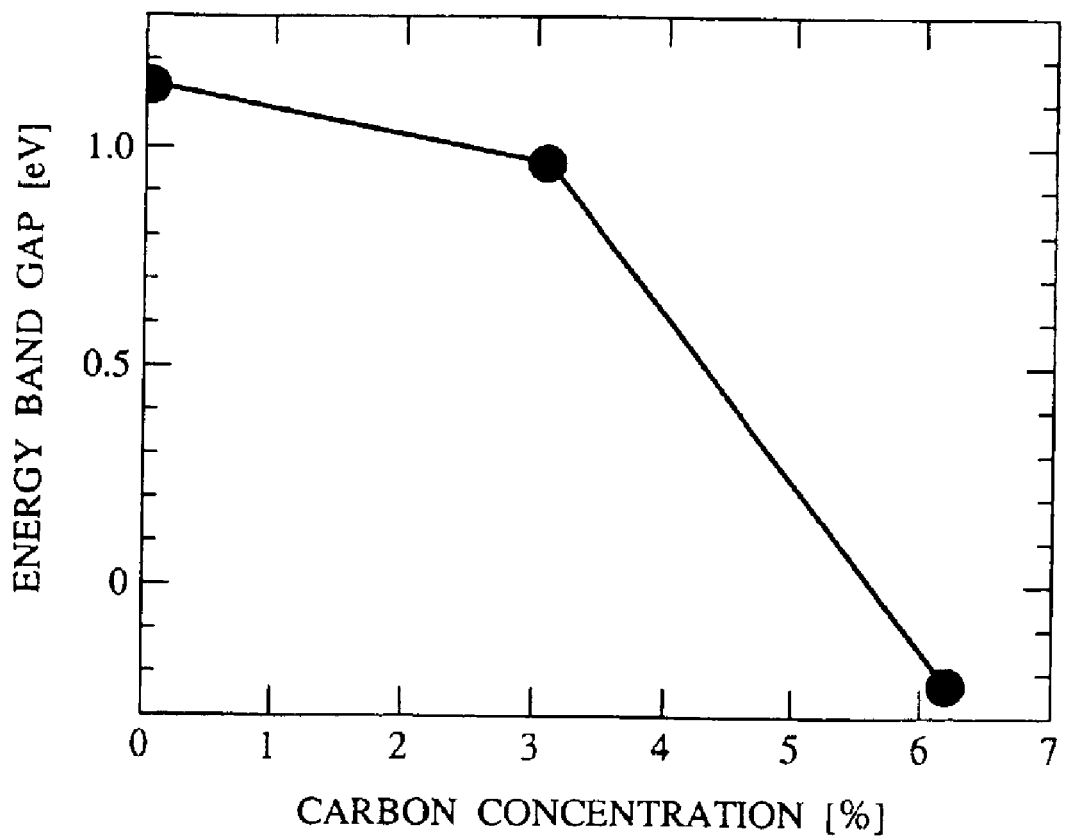
FIG. 3 is a graph of relationship between the energy band gap and carbon concentration of SiGeC.

FIG. 1 is a diagrammatic sectional view of the semiconductor device according to the present embodiment, which shows the structure thereof. FIGS. 2A and 2B are graphs of energy band structures at the interface between the channel region and the source/drain region of the semiconductor device according to the present embodiment. FIG. 3 is a graph of relationship between the energy band gap and carbon concentration of SiGeC. FIGS. 4A–4C and 5A–5C are sectional views of the semiconductor device according to the present embodiment in the steps of the method for fabricating the same.

First, the structure of the semiconductor device according to the present embodiment will be explained with reference to FIGS. 1, 2A–2B and 3.

A silicon oxide film 12 is formed on a silicon substrate 10. A channel region of a mesa-shaped silicon layer 14 is formed on the silicon oxide film 12. A semimetal layer 26 of SiGeC is formed on both sides of the channel region of the silicon layer 14 interposing a composition graded layer 24 having a composition which changes from Si to semimetallic SiGeC therebetween. A gate electrode 30 is formed on the silicon layer 14 interposing a gate insulation film 16 therebetween. A sidewall insulation film 22 is formed on the side walls of the gate electrode 30. Source/drain electrodes 28 are formed respectively on the semimetal layer 26 on both sides of the gate electrode 30.

As described above, the semiconductor device according to the present embodiment is characterized mainly in that the source/drain regions are formed of the semimetal layer 26 of SiGeC. The source/drain regions are formed of the semimetal layer 26, whereby the parasitic resistance in the parasitic region can be low because of a number of carriers in the semimetal layer 26. Semimetal material has a number of carriers as in the metal material.

Figure 29:
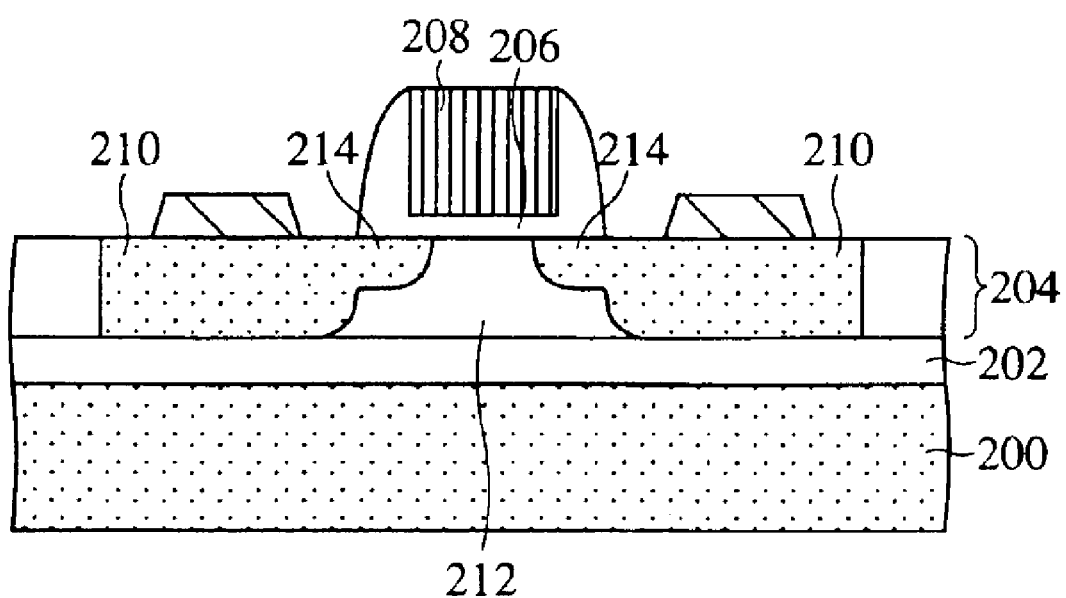
FIG. 29 is a diagrammatic sectional view of the first conventional semiconductor device, which shows a structure thereof.
Figure 30:
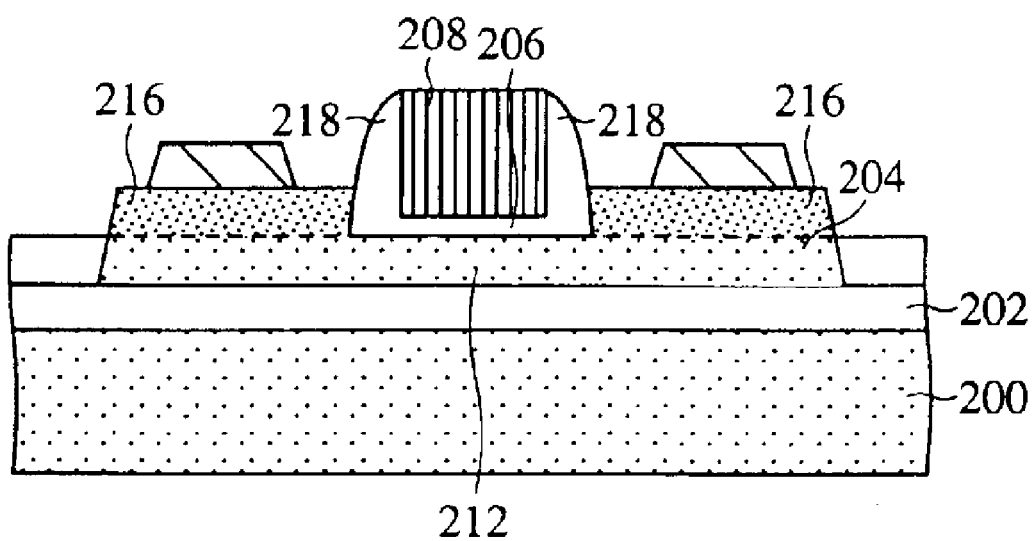
FIG. 30 is a diagrammatic sectional view of the second conventional semiconductor device, which shows a structure thereof.

Accordingly, in comparison with the conventional semiconductor device having the source/drain regions formed by ion-implanting a dopant as shown in FIG. 29, the semiconductor device according to the present embodiment can much decrease the parasitic resistance in the source/drain regions. Specifically, in the semiconductor device according to the present embodiment, the semimetal layer 26 is extended immediately below the vicinity of the end of the gate electrode 30. That is, the semimetal layer 26 forms a junction with the channel region. In comparison with the conventional semiconductor device shown in FIG. 30, the semiconductor device according to the present embodiment can much reduce the parasitic resistance in the source/drain regions.

In the specification, the channel region means a region immediately below the gate electrode which actually functions as the channel when the transistor is actuated. Accordingly, in the specification, the wording that the channel region, and the source region or the drain region form a junction with each other means that the junction between the channel region, and the source region or the drain region is positioned below the gate electrode or immediately below the end of the gate electrode.

It is not necessary to ion-implant a dopant in the source/drain regions, which makes it unnecessary to consider statistic fluctuation, which becomes a problem as elements are increasingly micronized.

Figure 31A:
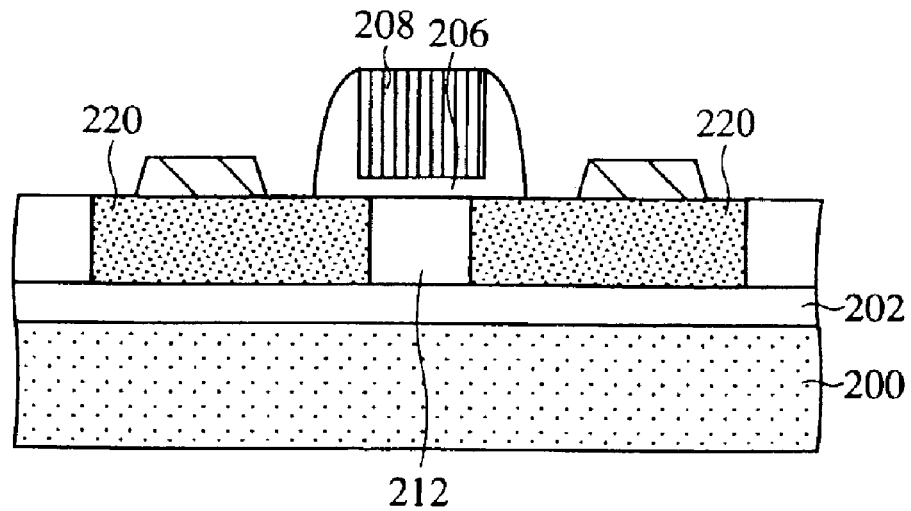
FIG. 31A is a diagrammatic sectional view of the third conventional semiconductor device, which shows a structure thereof.
Figure 31B:
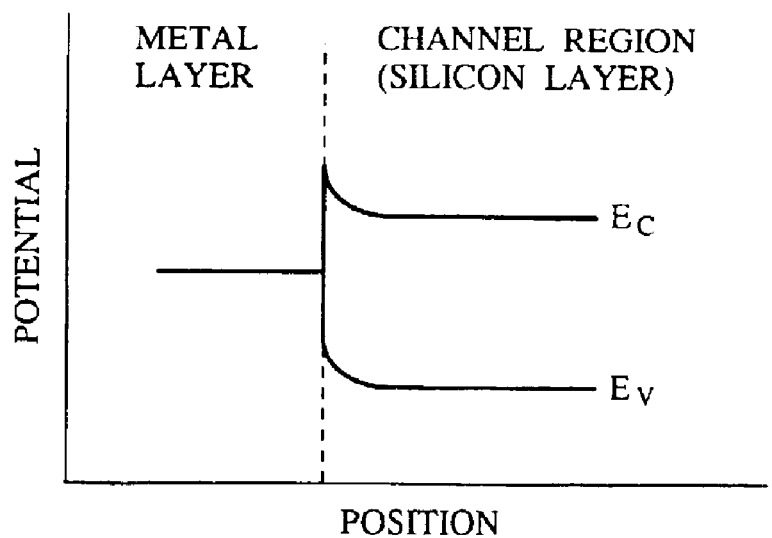
FIG. 31B is a graph of energy band structure at the interface between the channel region and the source/drain region of the third conventional semiconductor device.
Figure 32:
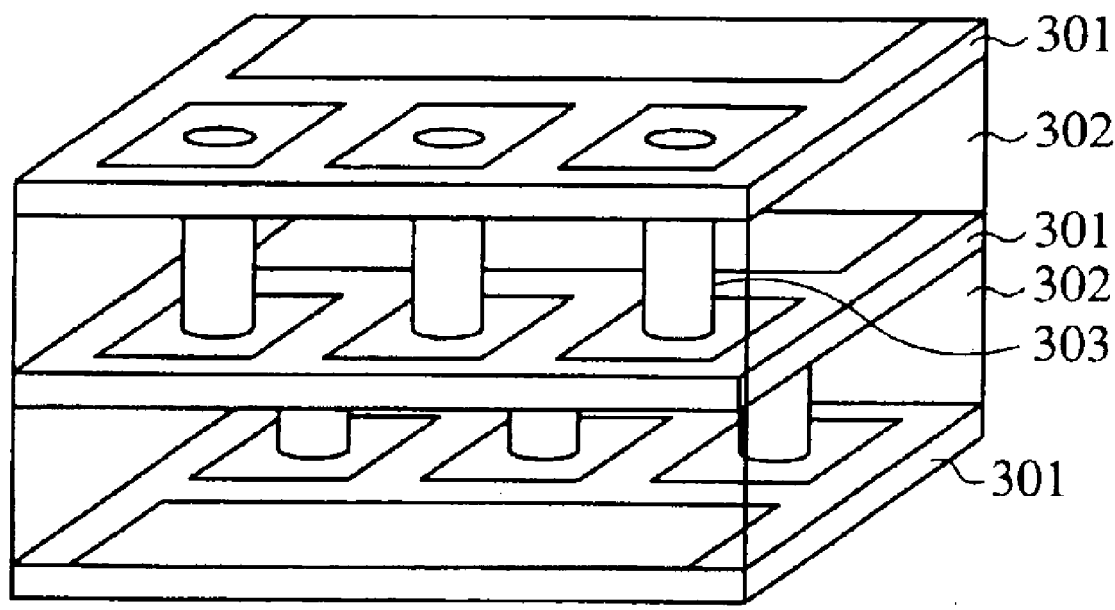
FIG. 32 is a diagrammatic perspective view of the conventional semiconductor integrated circuit.

The source/drain regions are formed of the semimetal layer 26, whereby, as is in the conventional semiconductor device forming the source/drain regions of the metal layer shown in FIG. 31, no large potential barrier, which is caused by the Schottky junction between the source/drain regions and the channel region, is formed (refer to FIG. 2A). Accordingly, the parasitic resistance in the junction region can be decreased.

Additionally, the composition graded layer 24 is provided between the channel region and the source/drain regions, whereby the band structure near the interface is as shown in FIG. 2B, and no potential barrier is present. Accordingly, the potential change in the junction interface can be made smooth, and the parasitic resistance can be further decreased.

Thus, the semiconductor device according to the present embodiment having such structure has no potential barrier between the source region and the channel region and between the drain region and the channel region, and a high-speed and high-frequency MOS transistor having abrupt doping profile formed by the crystal growth can be formed.

In the present embodiment, the semimetal layer 26 is formed of SiGeC. It is theoretically presumed that SiGeC can be epitaxially grown on Si, and can be semimetalized by suitably changing a composition (refer to, e.g., M. Ohfuti et al., Extended Abstracts of the 1999 International Conference on Solid State Device and Materials, Tokyo, 1999, pp. 476–477).

FIG. 3 is a graph of relationship between carbon concentration of SiGeC lattice-matched with Si, and energy band gap. As shown, the energy band gap tends to narrow as the carbon concentration increases. When the carbon concentration is increased to above about 6%, the semimetalization takes place. When a carbon concentration is about 6%, a Ge concentration in the SiGeC lattice-matched with Si is about 50%.

Next, the method for fabricating the semiconductor device according to the present embodiment will be explained with reference to FIGS. 4A–4C and 5A–5C.

First, an SOI substrate formed of the silicon oxide film 12 and the single crystal silicon layer 14 formed on the silicon substrate 10 is prepared. The SOI substrate may be an SOI substrate formed by bonding or may be an SIMOX substrate.

Next, the gate insulation film 16 is formed in a 3 nm-thick on the silicon layer 14 by, e.g., thermal oxidation.

Figure 4A:
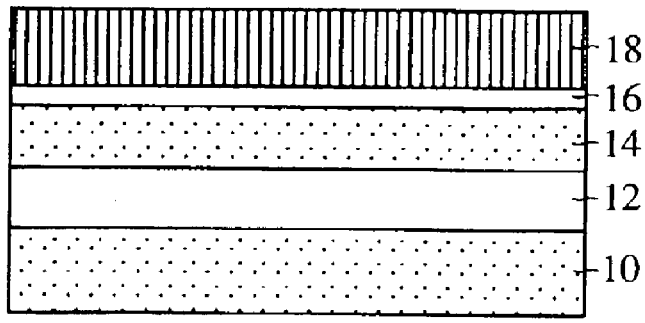
FIGS. 4A–4C and 5A–5C are sectional views of the semiconductor device according to the first embodiment of the present invention in the steps of the method for fabricating the same, which show the method.

Then, a 200 nm-thick polycrystalline silicon film 18 is formed on the gate insulation film 16 by, e.g., CVD method (FIG. 4A).

Next, the polycrystalline silicon film 18 is patterned by the usual lithography and etching. The patterning is made with the polycrystalline silicon film 18 left in a region where a gate electrode is to be formed. Hereinafter, the patterned polycrystalline silicon film 18 is called a dummy gate electrode 20.

The dummy gate electrode 20 is not essentially a conductive film and may be an insulating film. In the present specification, the dummy gate electrode 20 is called "an electrode" for convenience, but contains the structure of the insulation film.

Figure 4B:
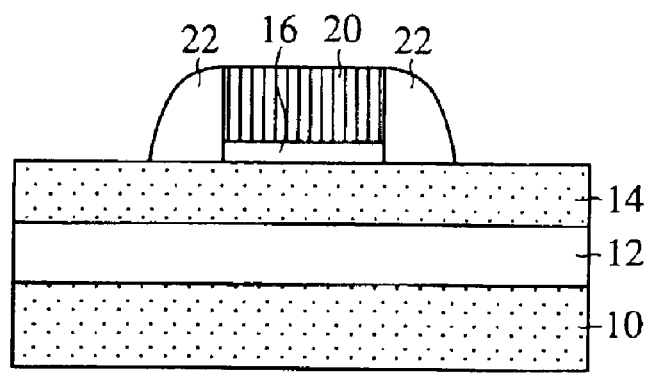

Next, a 50 nm-thick silicon oxide film is deposited on the entire surface by, e.g., CVD method. Then, the silicon oxide film is etched back to form a sidewall insulation film 22 of the silicon oxide film on the side walls of the dummy gate electrode 20 (FIG. 4B).

Figure 4C:
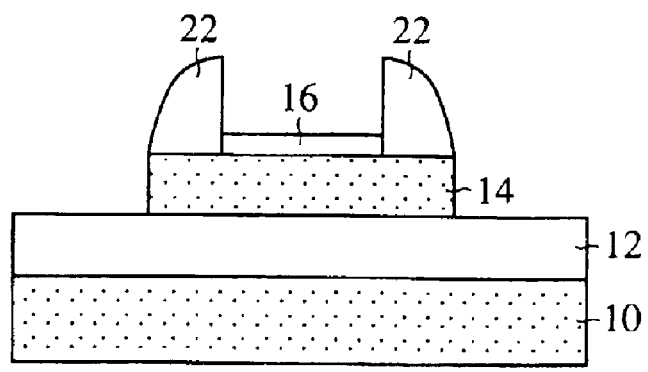

Then, the dummy gate electrode 20 is etched with wet etching using an etchant which can selectively etch the dummy gate electrode 20 with respect to the silicon oxide film 12 and the sidewall insulation film 22 or anisotropic dry etching (FIG. 4C). For example, wet etching using a chemical liquid of a composition, $1HF+3HNO_3+8CH_3COOH$, or dry etching using an HBr-based gas can be used.

Figure 5A:
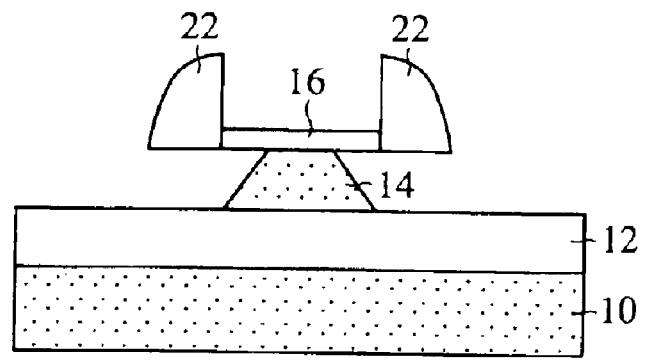

Next, the silicon layer 14 is removed up to the vicinity of the ends of the region where the dummy gate electrode 20 has been removed by laterally advancing etching (FIG. 5A).

In this etching, an etchant whose etching rate has plane orientation dependency is used, whereby as shown in FIG. 5A, the etched end faces of the silicon layer 14 can have a prescribed inclination angle which is dependent on a plane orientation of the silicon layer 14. For example, $NH_2(CH_2)_2NH_2$-based solution is used as an etchant so as to make such etching.

The etched end faces of the silicon layer 14 may be formed substantially vertical to the substrate by using an etchant which anisotropically advancing the etching in place of using an etchant whose etching rate has plane orientation dependency. For such etching, for example, dry etching using as an etchant an HBr-based gas which is made less anisotropic may be made.

Next, with the silicon layer 14 as a seed, the composition graded layer 24, which lattice-matches with Si and a composition of which changes from Si to semi-metallic SiGeC is selectively epitaxially grown in a 2–10 nm-thick by, e.g., MOVPE method. The composition graded layer 24 of SiGeC is formed by gradually changing, for example, a C composition from 0% to 6% and a Ge composition from 0% to 50%, whereby SiGeC which lattice-matches with Si and transits from a semiconductor to a semimetal can be formed.

Such growth is called ELO (Enhanced Lateral Over-Growth).

Figure 5B:
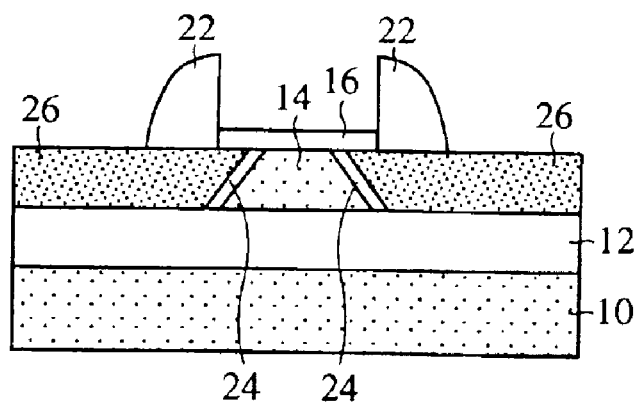

Then, with the composition graded layer 24 as a seed, the semimetal layer 26 of SiGeC is selectively epitaxially grown by, e.g., MOVPE (FIG. 5B). Semimetallic SiGeC can be formed by setting a C composition to be 6% and a Ge composition to be 50%.

The composition graded layer 24 and the semimetal layer 26 of SiGeC are formed, e.g., at a film forming temperature of 550–600° C. and a chamber pressure of 20 Torr, using $SiH_4$ (silane), $GeH_4$ (germanium) and $CH_3SiH_3$ (monomethyl silane).

Figure 5C:
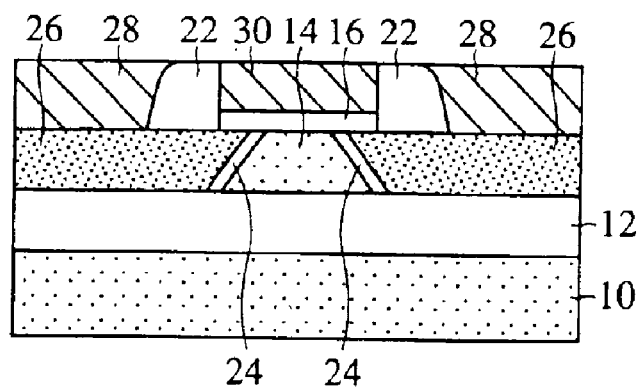

Then, W (tungsten) or Al (aluminum) is deposited in a 200 nm-thick on the entire surface by, e.g., evaporation method, and the surface of the film is polished by, e.g., CMP method to form the source/drain electrodes 28 on the semimetal layer 26, and the gate electrode 30 on the gate insulation film 16 (FIG. 5C).

As described above, according to the present embodiment, the source/drain regions, which form junctions with the channel region, are formed of the semimetal layer 26 of SiGeC, whereby parasitic resistance between the source region and the drain region can be much decreased. The composition graded layer is formed between the channel region and the semimetal layer, whereby the parasitic resistance can further decreased.

In the present embodiment, the composition graded layer 24 is provided between the semimetal layer 26 and the silicon layer 14, which is the channel region, but the semimetal layer 26 may be in direct junction with the silicon layer 14.

In the present embodiment, an SOI substrate is used. However, a bulk silicon substrate may be used, and, in this case, in the etching step of FIG. 4C, the silicon substrate is etched up to a vicinity of the ends of the dummy gate electrode 20 and down to an arbitrary depth. The composition graded layer 24 and the semimetal layer 26 can be grown with the side faces and bottom face of the silicon substrate exposed by the etching used as seeds.

In the present embodiment, the semimetal layer 26 is provided both in the source region and the drain region. However, the semimetal layer may be provided in one of the source/drain regions. In this case, a dopant is heavily implanted in one (e.g., the drain region) of the source region and the drain region to form a heavily doped region in the step of FIG. 4B, the silicon layer 14 in the other (e.g., the source region) of the source region and the drain region is removed in the step of FIG. 4C, and the composition graded layer 24 and the semimetal layer 26 forming a junction with the channel region only in the other (source region) is formed.

What much influences transistor characteristics is mainly the parasitic resistance of the source region. Accordingly, the semimetal layer 26 is formed only on the source region as described above, whereby the above-described effect of the present invention can be produced. Such structure is very effective for high breakdown voltage transistors.

In the present embodiment, the present invention is applied to the so-called damascene transistor having the gate electrode 30 formed by burying the electrode material in a groove. However, the present invention is applicable to the usual fabrication method, in which a gate electrode is formed by depositing and patterning a gate material. In this case, for example, a gate electrode material having etching selectivity with respect to silicon is deposited in place of the polycrystalline silicon film 18 in the step of FIG. 4A, the dummy gate electrode 20 formed in the step of FIG. 4B can be used as the gate electrode 30. It is possible that in the step of FIG. 4A, a layered film of a gate electrode material and a material having etching selectivity with respect to silicon is deposited in place of the polycrystalline silicon film 18, and the gate electrode is kept form the etching in the step of FIG. 4C.

[A Second Embodiment]

The semiconductor device and the method for fabricating the same according to a second embodiment of the present invention will be explained with reference to FIGS. 6, 7A–7C and 8A–8C. The same members of the present embodiment as those of the semiconductor device and the method for fabricating the same according to the first embodiment are represented by the same reference numbers not to repeat or to simplify their explanation.

Figure 6:
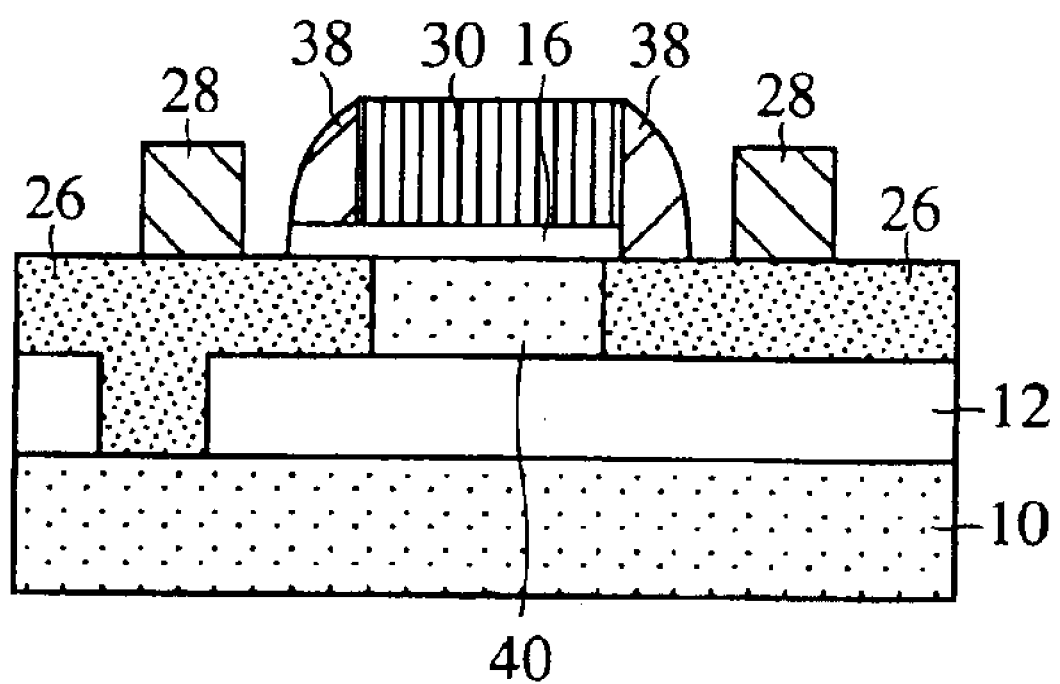
FIG. 6 is a diagrammatic sectional view of the semiconductor device according to a second embodiment of the present invention, which shows a structure thereof.

FIG. 6 is a diagrammatic sectional view of the semiconductor device according to the present embodiment, which shows a structure thereof. FIGS. 7A–7C and 8A–8C are sectional views of the semiconductor device according to the present embodiment in the steps of the method for fabricating the semiconductor device, which show the method.

First, the structure of the semiconductor device according to the present embodiment will be explained with reference to FIG. 6.

The structure of the semiconductor device according to the present embodiment is basically the same as that of the semiconductor device according to the first embodiment shown in FIG. 1. A silicon oxide film 12 is formed on a silicon substrate 10. A channel region 40 of a single crystal silicon layer is formed on the silicon oxide film 12. A semimetal layer 26 of semimetallic SiGeC is formed on both sides of the channel region 40. A gate electrode 30 is formed on the channel region 40 interposing a gate insulation film 16 therebetween. Source/drain electrodes 28 are formed on the semimetal layer 26 respectively on both sides of the gate electrode 30.

The semiconductor device according to the present embodiment is characterized mainly in that a part of the semimetal layer 26 on the side of the source region is connected to the silicon substrate 10 through a via hole 32. A part of the semimetal layer 26 is connected to the silicon substrate 10 so that the semimetal layer 26 and the channel region 40 grow with the silicon substrate 10 as a seed.

Next, the semiconductor device and the method for fabricating the same according to the present embodiment will be detailed with reference to the fabrication method shown in FIGS. 7A–8C and 8A–8C.

First, a 100 nm-thick silicon oxide film 12 is formed on the silicon substrate 10 by, e.g., CVD method.

Next, the via hole 32 is formed in the silicon oxide film 12 by the usual lithography and etching, arriving at the silicon substrate 10.

Next, an about 100 nm-thick amorphous silicon film 34 is formed on the entire surface by, e.g., CVD method. At this time, the via hole 32 formed in the silicon oxide film 12 is filled with the amorphous silicon film 34.

Then, the surface of the amorphous silicon film 34 is planarized by, e.g., CMP method.

Next, the gate insulation film 16 of a 3 nm-thick silicon oxide film is formed on the entire surface by, e.g., CVD method.

Then, the polycrystalline silicon film 36 is formed in a 200 nm-thick on the entire surface by, e.g., CVD method.

Figure 7A:
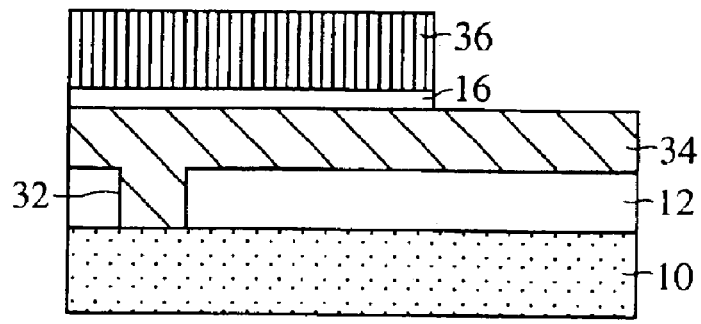
FIGS. 7A–7C and 8A–8C are sectional views of the semiconductor device according to the second embodiment of the present invention in the steps of the method for fabricating the same, which show the method.

Next, the polycrystalline silicon film 36 and the gate insulation film 16 in a region which is to be the drain region is selectively removed by the usual lithography and the etching (FIG. 7A).

Then, the polycrystalline silicon film 36 is patterned by the usual lithography and etching to form the gate electrode 30 of the polycrystalline silicon film 36. At this time, the polycrystalline silicon film 36 is patterned so that the gate insulation film 26 on the side of the source region is not removed.

Figure 7B:
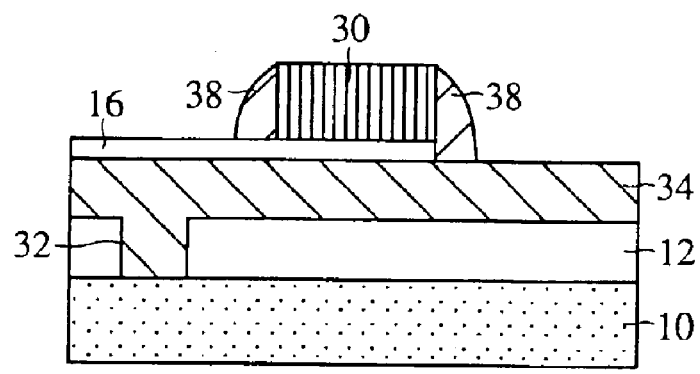

Next, a 50 nm-thick silicon nitride film is deposited on the entire surface by, e.g., CVD method. Then, the silicon nitride film is etched back to form a sidewall insulation film 38 of the silicon nitride film on the side walls of the gate electrode 30 (FIG. 7B).

Figure 7C:
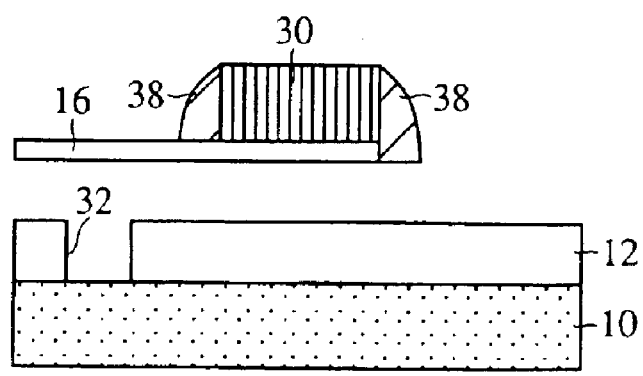

Then, the amorphous silicon film 34 is selectively removed by wet etching using phosphoric acid and KOH (FIG. 7C). In FIG. 7C, the gate insulation film 34 and the gate electrode 36 are shown separate from the silicon substrate 10 but is supported on the silicon substrate 10 by the amorphous silicon film 34 remaining in the region not shown, a device isolation film (not shown) separately formed, etc. The sidewall insulation film 38 may be removed together with the amorphous silicon film 34.

Figure 8A:
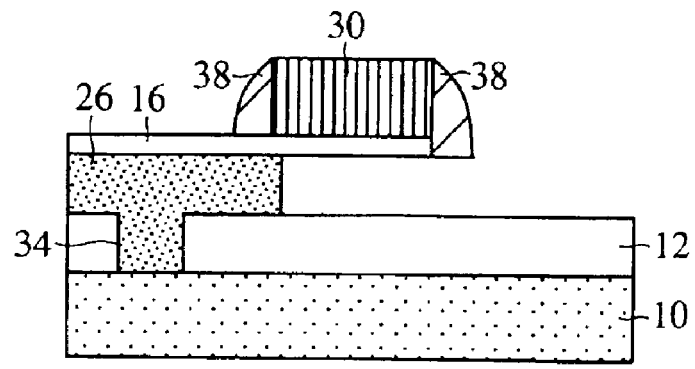

Next, with the silicon substrate exposed in the via hole 32 formed in the silicon oxide film 12, the semimetal layer 26 of SiGeC, which lattice-matches with Si, is selectively epitaxially grown. Semimetallic SiGeC can be formed by setting a composition of, e.g., 6% C and 50% Ge (FIG. 8A). This growth goes on along a gap between the silicon oxide film 12 and the gate insulation film 16 with the silicon substrate 10 exposed in the via hole as an origin.

Then, when the grown face of the semimetal layer 26 reaches a vicinity of the end of the gate electrode 30 on the side of the source, the supply of Ge and C source gases is stopped to epitaxially grow a non-doped silicon layer continuous to the semimetal layer 26. Thus, the channel region 40 of the non-doped silicon layer is formed immediately below the gate electrode 30.

Figure 8B:
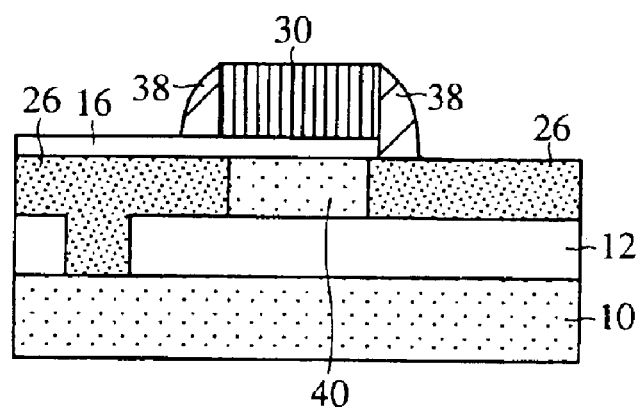

Next, when the grown face of the silicon layer forming the channel region 40 reaches a vicinity of the end of the gate electrode 30 on the side of the drain, the supply of Ge and C source gases is started again to selectively epitaxially grown the semimetal layer 26 of SiGeC, which lattice-matches with Si. Thus, the semimetal layer 26 is formed on the side of the drain (FIG. 8B).

A merit of the present embodiment is that the semimetal layer 26, the channel region 40 and the semimetal layer 26 on the side of the drain can be continuously formed. That is, without breaking the vacuum in the film forming apparatus, the semimetal layer 26 on the side of the source and on the side of the channel region 40 and the drain can be formed, whereby the source/channel interface and the drain/channel interface are not exposed to the air, and can have good interface characteristics. In this point, the present embodiment is superior to the semiconductor device according to the first embodiment, wherein the semimetal layer 26 is formed after the silicon layer 14 has been etched.

Figure 8C:
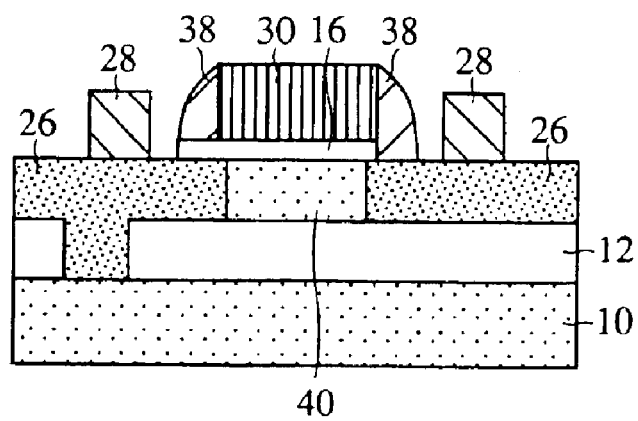

Next, the gate insulation film 16 remaining on the semimetal layer 26 on the side of the source is removed, and the source/drain electrodes 28 are formed on the semimetal layer 26 respectively on both sides of the gate electrode 30 (FIG. 8C).

As described above, according to the present embodiment, the source/drain regions forming junctions with the channel region 40 is formed of the semimetal layer 26, whereby parasitic resistance between the source region and the drain region can be much decreased.

In the present embodiment, no composition degraded layer is provided between the channel region 40 and the semimetal layer 26, but as in the semiconductor device according to the first embodiment, the composition graded layer may be provided, whereby the parasitic resistance can be further decreased.

In the present embodiment, the semimetal layer 26 is provided in both the source region and the drain region. However, the semimetal layer 26 may be provided in only one of the source and the drain regions. In this case, the silicon layer is epitaxially grown also in the drain region continuously to the channel region 40 in the step of FIG. 8B, and then the silicon layer in the drain layer is doped to form a heavily doped region.

In the present embodiment, the amorphous silicon film 34 is selectively removed, and then in the region the semimetal layer 26 and the channel region 40 are formed. The film to be selectively removed is not essentially amorphous silicon film. The selectively-to-be-removed film may be a film which can be removed without etching at least the gate insulation film 16 and the silicon oxide film 12. For example, silicon nitride film can be used in place of amorphous silicon film.

As in the semiconductor device according to the first embodiment, the present embodiment may be applied to a damascene transistor having the gate electrode formed by burying the gate material in a groove.

[A Third Embodiment]

The semiconductor device and the method for fabricating the same according to a third embodiment of the present invention will be explained with reference to FIGS. 9, 10A–10D, and 11A–11B. The same members of the present embodiment as those of the semiconductor device and the method for fabricating the same according to the first embodiment shown in FIGS. 1, 4A–4C and 5A–5C are represented by the same reference numbers not to repeat or to simplify their explanation.

Figure 9:
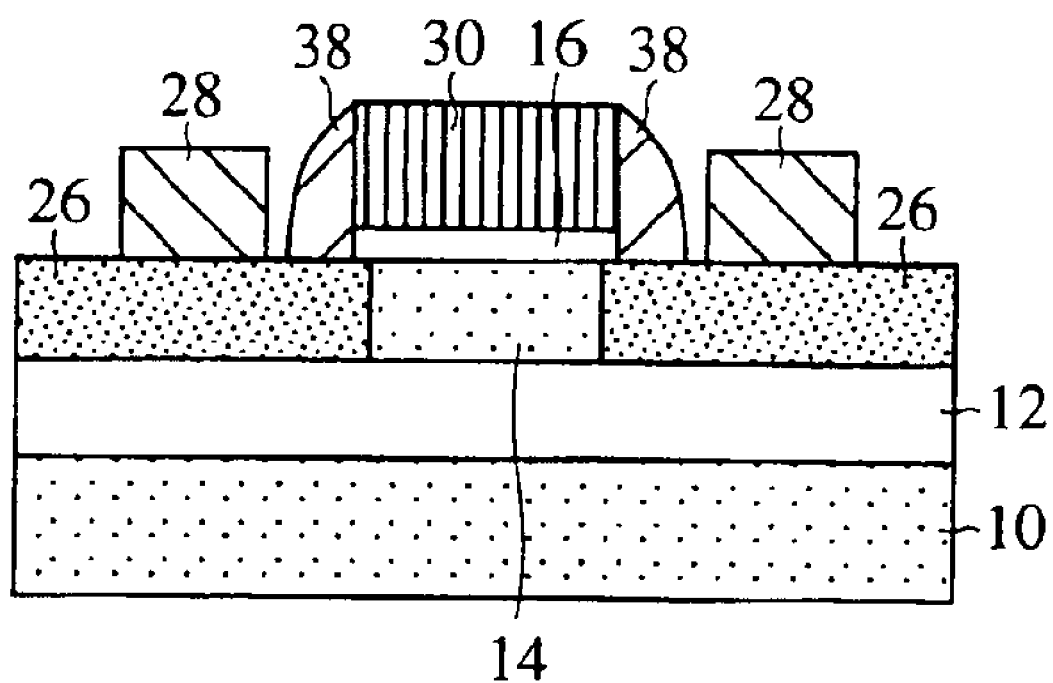
FIG. 9 is diagrammatic section view of the semiconductor device according to a third embodiment of the present invention, which shows a structure thereof.

FIG. 9 is a diagrammatic sectional view of the semiconductor device according to the present embodiment, which shows the structure thereof. FIGS. 10A–10D are sectional views of the semiconductor device according to the present embodiment in the steps of the method for fabricating the same, which show the method. FIGS. 11A–11B are perspective views of the semiconductor device according to the present embodiment in the steps of the method for fabricating the same, which shows the method.

First, a structure of the semiconductor device according to the present embodiment will be explained with reference to FIG. 9.

The structure of the semiconductor device according to the present embodiment is basically the same as that of the semiconductor device according to the first embodiment shown in FIG. 1. That is, a silicon oxide film 12 is formed on a silicon substrate 10. A single crystal silicon layer 14 is formed on the silicon oxide film 12. A semimetal layer 16 of a semimetallic SiGeC is formed on both sides of the silicon layer 14. A gate electrode 30 is formed on the silicon layer 14 interposing a gate insulation film 16 therebetween. Source/drain electrodes 28 are formed respectively on both sides of the gate electrode 30.

Next, the method for fabricating the semiconductor device according to the present embodiment will be explained with reference to FIGS. 10A–10D and 11A–11B.

First, an SOI substrate having the silicon oxide film 12 and the silicon layer 14 formed on the silicon substrate 10 is prepared.

Next, the gate insulation film is formed of an 3 nm-thick silicon oxide film on the silicon layer 14 by, e.g., thermal oxidation.

Figure 10A:
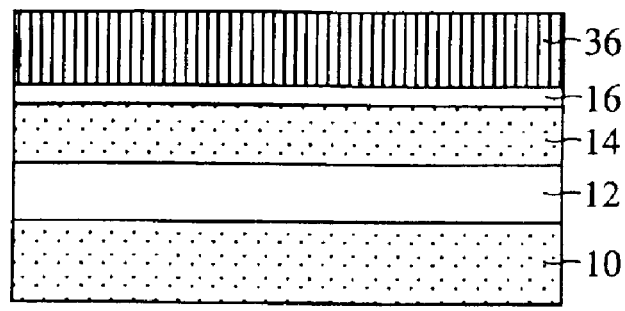
FIGS. 10A–10D are sectional views of the semiconductor device according to the third embodiment of the present invention in the steps of the method for fabricating the same, which show the method.
Figure 11A:
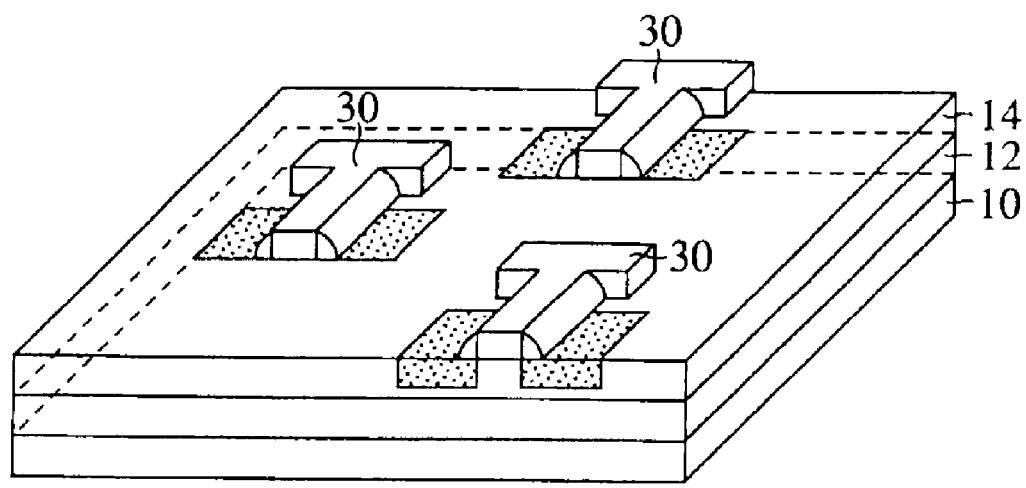
FIGS. 11A and 11B are perspective views of the semiconductor device according to the third embodiment of the present invention, which show the method for fabricating the same.
Figure 11B:
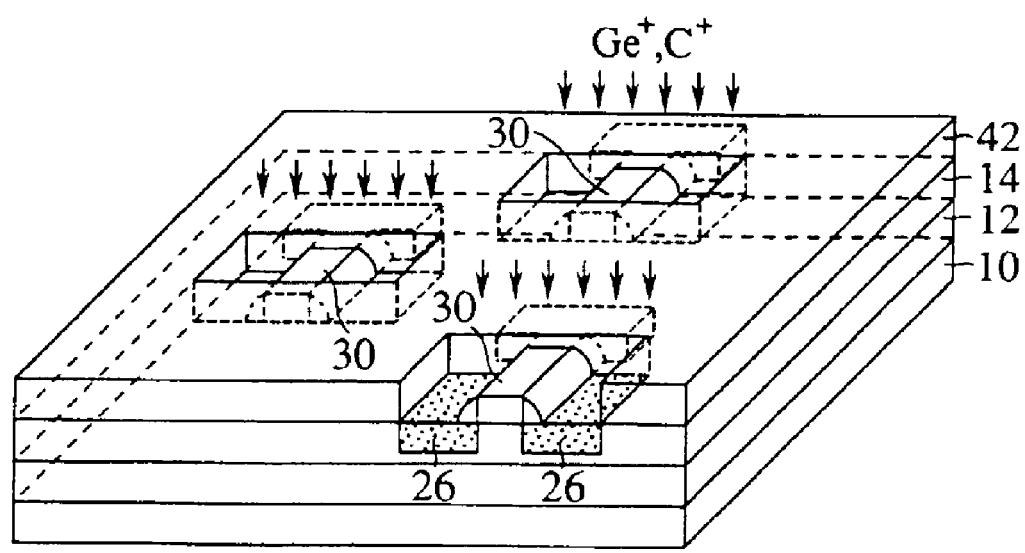

Then, a 200 nm-thick polycrystalline silicon film 36 is formed on the gate insulation film 16 by, e.g., CVD method (FIG. 10A).

Next, the polycrystalline silicon film 36 is patterned by the usual lithography and etching to form the gate electrode 30 of the polycrystalline silicon film.

Figure 10B:
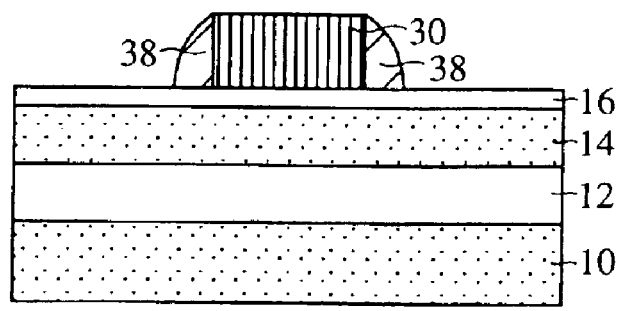

Next, a 50 nm-thick silicon nitride film is deposited on the entire surface by, e.g., CVD method. Then, the silicon nitride film is etched back to form a sidewall insulation film 38 of the silicon nitride film on the side walls of the gate electrode 30 (FIG. 10B and FIG. 11A).

Then, a 500 nm-thick silicon oxide film 42 on the entire surface by, e.g., CVD method.

Next, the silicon oxide film 42 is patterned by the usual lithography and etching to expose the silicon layer 14 in regions where the source/drain regions are to be formed.

Then, with the silicon oxide film 42 as a mask, Ge ions and C ions are implanted selectively in the source/drain regions (FIG. 11B). For example, Ge ions are implanted at 50 keV acceleration energy and a $1 \times 10^{16}$ cm$^2$ dose, and C ions are implanted at 0.15 keV acceleration energy and a $1 \times 10^{16}$ cm$^{-2}$ dose.

At this time, the sidewall insulation film 38 formed on the side walls of the gate electrode 30 plays a role of preventing the Ge and C ions from being excessively incorporated below the gate electrode to thereby corrode the channel region.

Figure 10C:
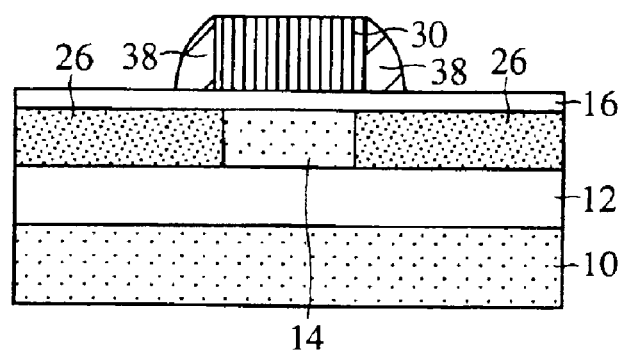

Next, heat processing is made, e.g., at above 1000° C. and for about 10 seconds to transform the silicon layer 14 in the region with the Ge ions and the C ions implanted in to the SiGeC layer. Thus, the semimetal layer 26 of SiGeC is formed in the source/drain regions (FIG. 10C).

Figure 10D:
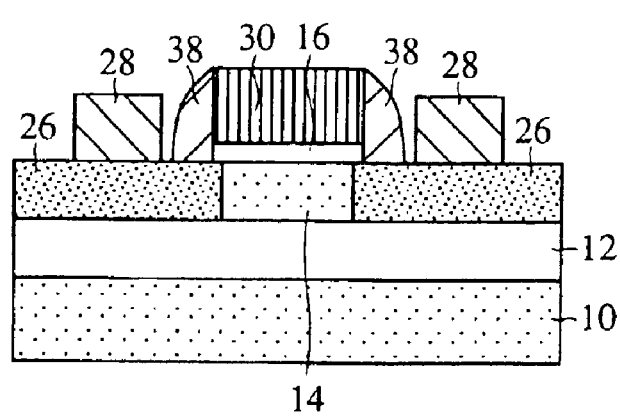

Next, the source/drain electrodes 28 are formed on the semimetal layer 26 on both sides of the gate electrode 30 (FIG. 10D).

As described above, according to the present embodiment, the source/drain regions forming junctions with the channel region are formed of the semimetal layer 26 of SiGeC, whereby parasitic resistance between the source region and the drain region can be much decreased.

In the present embodiment, the semimetal layer 26 is provided both in the source region and the drain region. However, the semimetal layer 26 may be provided in either of the source/drain regions. In this case, in the step of FIG. 11B, Ge ions and C ions may be implanted in one of the source region and the drain region (e.g., in the source region), and a dopant may be heavily implanted in the other region (e.g., the drain region) to form a heavily doped region.

In the present embodiment, Ge ions and C ions are implanted in the silicon layer 14 to thereby form SiGeC. However, Ge and C ions may be introduced into the silicon layer 14 by solid phase diffusion method.

In the present embodiment, an SOI substrate is used, but a bulk silicon substrate may be used.

[A Fourth Embodiment]

The semiconductor device and the method for fabricating the same according to a fourth embodiment of the present invention will be explained with reference to FIGS. 12A–12B, 13A–13C, and 14A–14C.

Figure 12A:
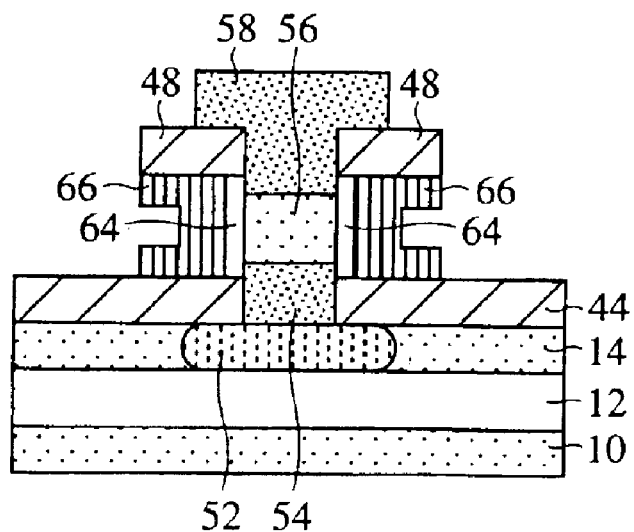
FIG. 12A is a diagrammatic section view of the semiconductor device according to a fourth embodiment of the present invention, which shows a structure thereof.
Figure 12B:
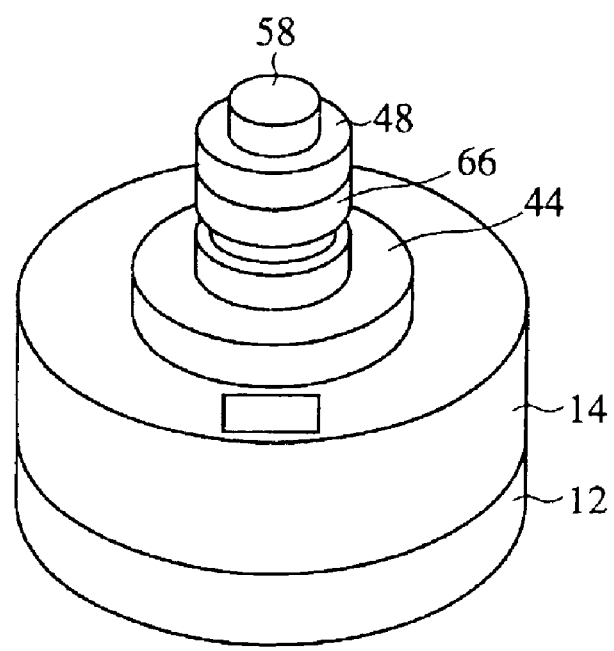
FIG. 12B is a perspective view of the semiconductor device according to the fourth embodiment of the present invention, which shows the structure thereof.

FIG. 12A is a diagrammatic sectional view of the semiconductor device, which show a structure thereof. FIG. 12B is a perspective view of the semiconductor device, which show a structure thereof. FIGS. 13A–13C and 14A–14C are sectional views of the semiconductor device according to the present embodiment in the steps of the method for fabricating the same, which show the method.

First, the structure of the semiconductor device according to the present embodiment will be explained with reference to FIGS. 12A and 12B.

A silicon oxide film 12 is formed on a silicon substrate 10. A single crystal silicon layer 14 is formed on the silicon oxide film 12. A heavily doped layer 52 is formed in the silicon layer 14. A semimetal layer 54 of SiGeC, a silicon layer 56 and a semimetal layer 58 of SiGeC are laid one on another on the heavily doped layer 52. A gate electrode 66 is formed, surrounding the silicon layer 56 intervening a gate insulation film 64 therebetween.

Thus, a MOS transistor of a surrounding gate structure having the source region formed of the semimetal layer 54, the channel region formed of the silicon layer 56 and the drain region formed of the semimetal layer 58 is formed.

The semiconductor device having such structure can much reduce parasitic resistance, as in the semiconductor device according to the first to the third embodiments, and can much enhance the effect of suppressing short channel effect.

Next, the method for fabricating the semiconductor device according to the present embodiment will be explained with reference to FIGS. 13A–13C and 14A–14C.

First, an SOI substrate having the silicon oxide film 12 and the silicon layer 14 formed on the silicon substrate 10 is prepared.

Then, a 50 nm-thick silicon nitride film 44 and a 50 nm-thick silicon oxide film 46 and a 50 nm-thick silicon nitride film 48 are formed on the silicon layer 14 by, e.g., CVD method.

Next, a through-hole 50 is formed by the usual lithography and etching through the silicon nitride film 48, the silicon oxide film 46 and the silicon nitride film 44 down to the silicon layer 14.

Figure 13A:
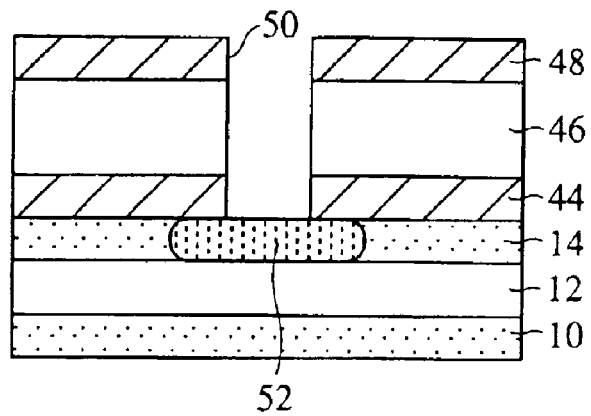
FIGS. 13A–13C and 14A–14C are sectional views of the semiconductor device according to the fourth embodiment of the present invention in the steps of the method for fabricating the semiconductor, which show the method.

Then, with the silicon nitride film 48, etc. as a mask, ion implantation is made to form the heavily doped layer 52 in the silicon layer 14 exposed in the through-hole 50. For example, As ions are implanted at 40 keV acceleration energy and a $1 \times 10^{16}$ cm$^{-2}$ dose to form the heavily doped layer 52 (FIG. 13A).

Figure 13B:
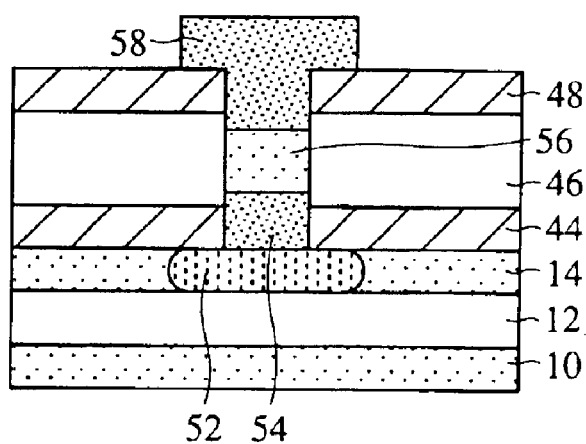

Next, with the surface of the silicon layer 14 exposed in the through-hole 50 as a seed, the semimetal layer 54 of SiGeC, the silicon layer 56 and the semimetal layer 58 of SiGeC are selectively sequentially epitaxially grown by, e.g., MOVPE method (FIG. 13B). The conditions for forming the semimetal layers 54, 58 and the silicon layer 56 are the same as those of the first and the second embodiment.

Next, the silicon nitride film 60 and the silicon oxide film 62 are formed on the entire surface by, e.g., CVD method.

Figure 13C:
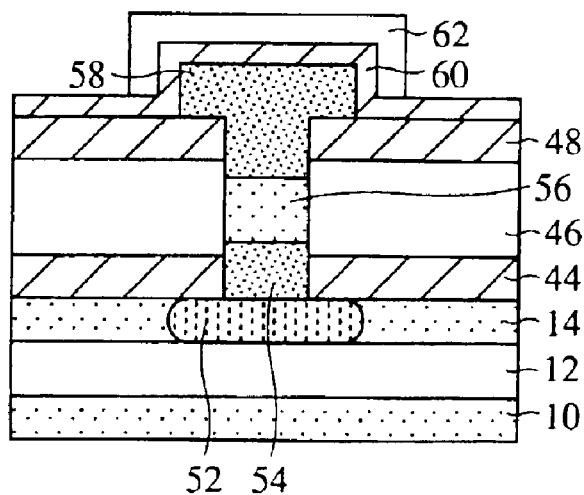

Then, the silicon oxide film 62 is patterned by the usual lithography and etching to remain in the region where the silicon oxide film 62 covers the semimetal layer 58 (FIG. 13C).

Figure 14A:
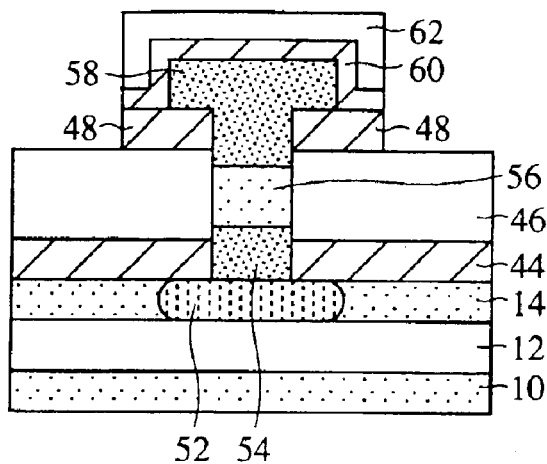

Next, the silicon nitride film 48 is anisotropically etched by, e.g., the usual dry etching with the silicon oxide film 62 as a mask (FIG. 14A).

Then, the silicon oxide films 62, 46 are selectively removed with the silicon nitride films 44, 48, 60 as a mask.

Figure 14B:
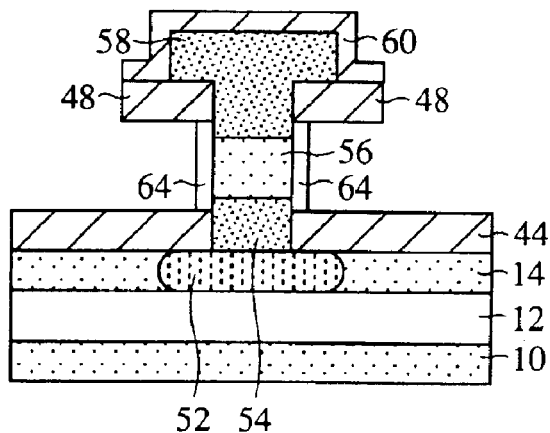

Next, the silicon layer 56 exposed by removing the silicon oxide film 46 is thermally oxidized by, e.g., thermal oxidation method to form the gate insulation film 64 surrounding the silicon layer 56 (FIG. 14B).

Figure 14C:
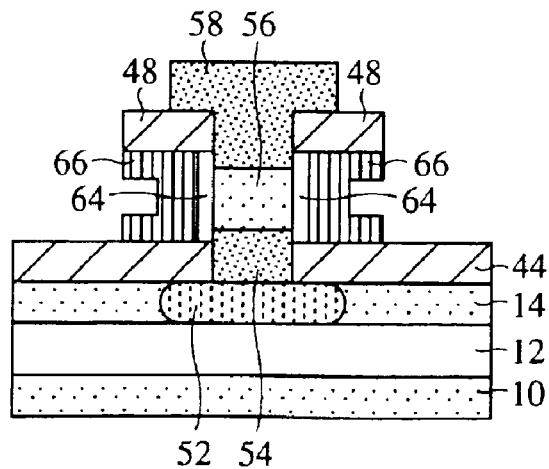

Next, a 200 nm-thick polycrystalline silicon film is deposited on the entire surface by, e.g., CVD method and etched back to form the gate electrode 66 around the silicon layer 56, surrounding the silicon layer 56 interposing the gate insulation film therebetween (FIG. 14C).

Thus, a MOS transistor of a surrounding gate structure having the source region formed of the semimetal layer 54, the channel region formed of the silicon layer 56 and the drain region formed of the semimetal layer 58 is formed.

As described above, according to the present embodiment, the source/drain regions forming junctions with the channel region 56 are formed of the semimetal layers 54, 58 of SiGeC, whereby parasitic resistance between the source and the drain can be much decreased. The surrounding gate structure can much further enhance the effect of depressing short channel effect.

The present embodiment has no composition graded layer between the channel region 56 and the semimetal layers 54, 58. However, the present embodiment may have the same composition graded layer as that of the semiconductor device according to the first embodiment, whereby parasitic resistance can be further decreased.

In the present embodiment, the semimetal layers 54, 58 are provided both in the source region and the drain region. However, the semimetal layers may be provided in either of the source/drain regions. In this case, the doped silicon layer may be epitaxially grown in the drain region continuous to the channel region 56 in the step of FIG. 13B.

In the present embodiment, an SOI substrate is used, but a bulk silicon substrate may be used.

[A Fifth Embodiment]

The semiconductor device and the method for fabricating the same according to a fifth embodiment of the present invention will be explained with reference to FIGS. 15, 16A–16C, and 17A–17C.

Figure 15:
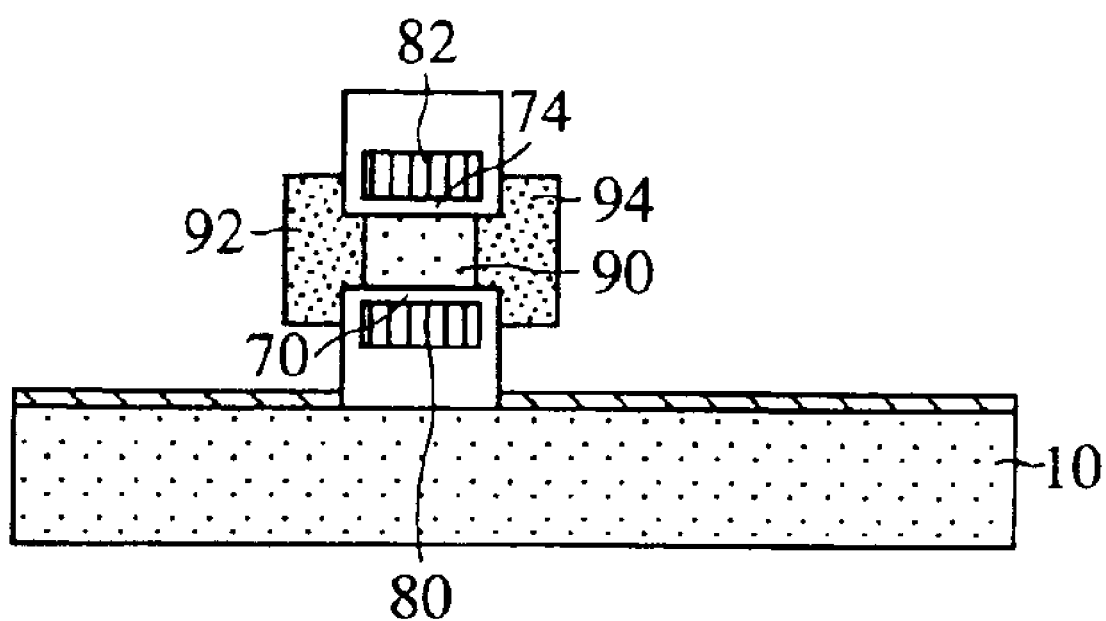
FIG. 15 is a diagrammatic sectional view of the semiconductor device according to a fifth embodiment of the present invention, which shows a structure thereof.

FIG. 15 is a diagrammatic sectional view of the semiconductor device according to the present invention, which shows a structure thereof. FIGS. 16A–16C and 17A–17C are sectional views of the semiconductor device in the steps of the method for fabricating the same, which show the method.

First, the structure of the semiconductor device according to the present embodiment will be explained with reference to FIG. 15.

A lower gate electrode 80 is formed on a silicon substrate 10, surrounded with an insulation film including a silicon oxide film 70. A channel region 90 of a single crystal silicon layer is formed on a silicon oxide film 70. An upper gate electrode 82 is formed on the channel region 90, surrounded with an insulation film including a silicon oxide film 74. A gate insulation film of the silicon oxide film 70 is formed between the lower electrode 80 and the channel region 90. An gate insulation film of the silicon oxide film 74 is formed between the upper gate electrode 82 and the channel region 90. Semimetal layers 92, 94 of SiGeC, which lattice-match with Si, is formed on both sides of the channel region 90.

Thus, a MOS transistor having the source region formed of the semimetal layer 92, the channel region 90 formed of the silicon layer and the drain region formed of the semimetal layer 94, and having a double gate structure having the lower gate electrode 80 and the upper gate electrode 82 formed on the top and the bottom of the channel region 90 is formed.

The semiconductor device has such structure, whereby the semiconductor device can much reduce parasitic resistance, as can the semiconductor device according to the first to the third embodiments, and can much enhance the effect of suppressing short channel effect.

Next, the method for fabricating the semiconductor device according to the present embodiment will be explained with reference to FIGS. 16A–16C and 17A–17C.

First, a 100 nm-thick silicon oxide film 12 is formed on the silicon substrate 10 by, e.g., thermal oxidation method.

Figure 16A:
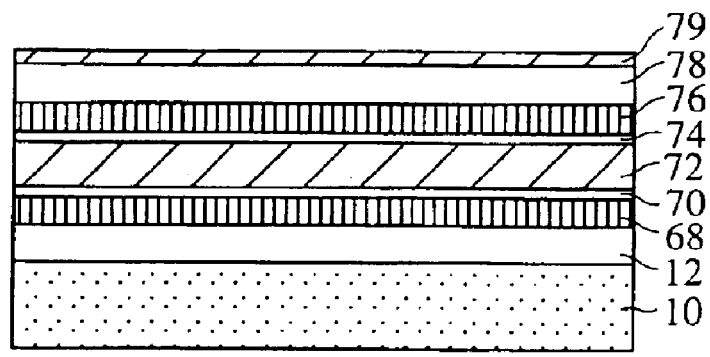
FIGS. 16A–16C and 17A–17C are sectional views of the semiconductor device according to the fifth embodiment of the present invention in the steps of the method for fabricating the same, which show the method.

Then, a 200 nm-thick polycrystalline silicon film 68, a 5 nm-thick silicon oxide film 70, a 30 nm-thick silicon nitride film 72, a 5 nm-thick silicon oxide film 74, a 200 nm-thick polycrystalline silicon film 76, a 100 nm-thick silicon oxide film 78, and a 50 nm-thick silicon nitride film 79 are sequentially deposited on the silicon oxide film 12 by, e.g., CVD method (FIG. 16A).

Then, the silicon nitride film 79, the silicon oxide film 78, the polycrystalline silicon film 76, the silicon oxide film 74, the silicon nitride film 72, the silicon oxide film 70, the polycrystalline silicon film 68 and the silicon oxide film 12 are patterned by the usual lithography and etching. Thus, the lower gate electrode 80 of the polycrystalline silicon film 68, and the upper gate electrode 82 of the polycrystalline silicon film 76 are formed. Thus, the upper gate electrode 80 and the upper gate electrode 82 are simultaneously patterned, whereby the alignment between the lower and the upper gate electrodes 80, 82 is not necessary.

Figure 16B:
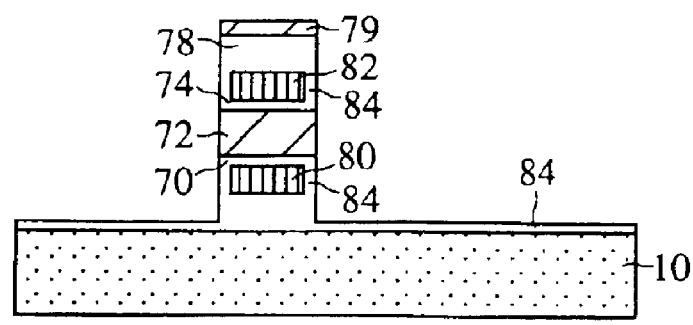

Next, a silicon oxide film 84 is formed on the silicon substrate 10 and on the side walls of the lower gate electrode 80 and the upper gate electrode 82 by, e.g., thermal oxidation method. Thus, the lower gate electrode 80 and the upper gate electrode 82 are thoroughly covered with the silicon oxide films 12, 70, 74, 78, 84 (FIG. 16B).

Next, a 700 nm-thick silicon oxide film 86 is formed on the entire surface by, e.g., CVD method.

Figure 16C:
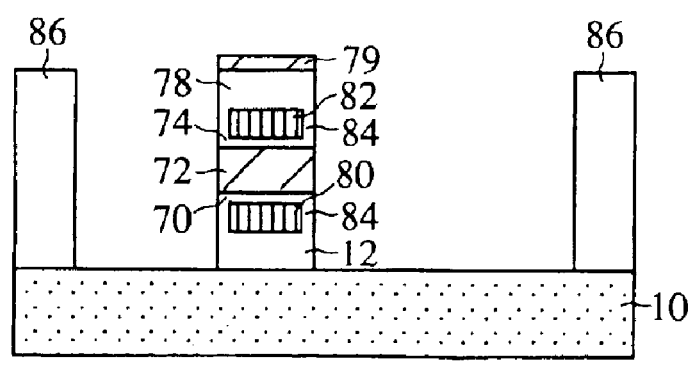

Then, the silicon oxide films 86, 84 are patterned by the usual lithography and anisotropic dry etching to selectively expose the region where the layer structure including the lower gate electrode 80, the upper electrode 82 is formed (FIG. 16C). At this time, one side is exposed in a larger area than the other side. In FIG. 16C, the region on the right side of the layer structure including the lower gate electrode 80 and the upper gate electrode 82 is larger.

Next, the silicon nitride films 79, 72 are removed by, e.g., wet etching using phosphoric acid. With the silicon nitride film 72 removed, the lower gate electrode 80 and the upper gate electrode 82 are separated in the shown region, but the upper gate electrode 82 is supported by the silicon nitride film 72, etc. in the region not shown.

Figure 17A:
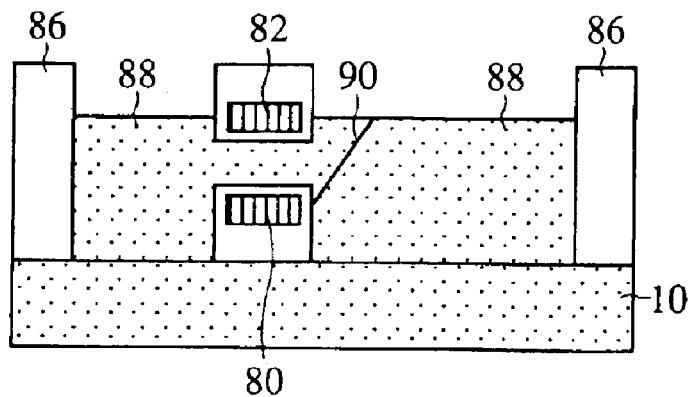

Next, with the silicon substrate 10 as a seed, a silicon layer is epitaxially grown by, e.g., MOVPE (FIG. 17A). At this time, the silicon layer 88 grows with the silicon substrate 10 in the region on the left side as the seed and with the silicon substrate 10 in the region on the right side meet each other not between the lower gate electrode 80 and the upper gate electrode 82 but in the region on the right side of the layer structure because the region on the right side of the layer structure including the lower gate electrode 80 and the upper gate electrode 82 is wider, and the region on the left side is smaller. Accordingly, the growth junction face 90, wherein crystal defects tend to take place, is not formed between the lower gate electrode 80 and the upper gate electrode 82.

Figure 17B:
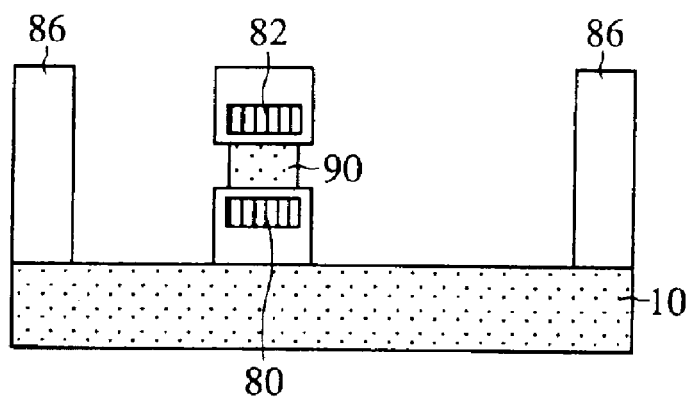
Figure 17C:
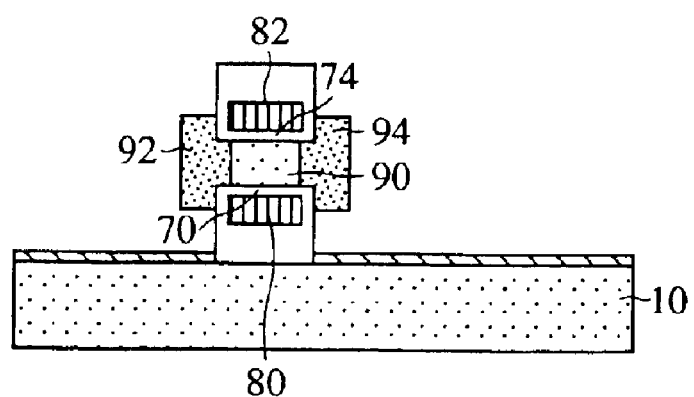

Then, the silicon layer 88 is anisotropically etched with the silicon oxide films 78, 86 as a mask to be left selectively between the lower gate electrode 80 and the upper gate electrode 82. Thus, the channel region 90 of the silicon layer 88 is formed (FIG. 17B). At this time, it is preferable that the silicon layer 88 is etched a little laterally to position the ends of the channel region between the lower gate electrode 80 and the upper gate electrode 82 so that parasitic resistance between the source/drain regions is not increased.

Then, with both ends of the channel region 90 as a seed, the semimetal layers 92, 94 of SiGeC, which lattice-matches with Si, is selectively epitaxially grown. Conditions for growing the semimetal layers 92, 94 are the same as those of the first and the second embodiments.

Thus, a MOS transistor of a double gate structure including the source region formed of the semimetal layer 92, the channel region 90 formed of the silicon layer 88 and the drain region formed of the semimetal layer 94, and including the lower gate electrode 80 formed interposing the silicon oxide film 70 as the gate insulation film, and the upper gate electrode formed interposing the silicon oxide film 74 as the gate insulation film can be formed.

As described above, according to the present embodiment, the source/drain regions forming junctions with the channel region 90 are formed of the semimetal layers 92, 94 of SiGeC, whereby parasitic resistance between the source region and the drain region can be much decreased. The double gate structure can much enhance the effect of suppressing short channel effect.

In the present embodiment, no composition graded layer is provided between the channel region 90 and the semimetal layers 92, 94. However, a composition graded layer may be provided as in the semiconductor device according to the first embodiment, and in this case parasitic resistance can be further decreased.

In the present embodiment, the silicon nitride film 72 is selectively removed, and in the region, the channel region 90 is formed. A film to be selectively removed is not essentially silicon nitride film. The film can be one which can be removed without etching at least the silicon oxide films 12, 70, 74, 78, 84. For example, amorphous silicon film can be used in place of silicon nitride film.

The present invention is not limited to the above-described embodiments and can cover other modifications.

For example, in the above-described embodiments, a material of the gate electrodes is polycrystalline silicon film. However, other materials may be used. In accordance with generations and structures of devices, polycide gates, polymetal gates, metal gates, etc. can be arbitrarily used.

[A Sixth Embodiment]

A semiconductor device according to a sixth embodiment of the present invention will be explained with reference to FIGS. 18, 19A–19B, 20A–20B, 21A–21B, 22A–22C, and 23A–23C. The present embodiment exemplifies a CMOS inverter having a three-dimensional structure of the semiconductor-semimetal structures.

First, a structure of a MOS transistor which is a basic structure of the MOS inverter will be explained before the MOS inverter according to the present embodiment is explained.

Recently, for high-speed and high-performance characteristics of silicon devices, it has started to be studied incorporation of lattice strain or new materials, such as silicon germanium or others, as materials of the silicon devices, in place of silicon, which has been used in the pure state. As a new hetero-junction material which lattice-matches with silicon, silicon germanium carbon (SiGeC) is being studied. Ohfuti et al. have presumed by the so-called the first principle method for molecular dynamics calculation that carbon is incorporated in an above 6 atoms % concentration, maintaining conditions for the lattice-match with silicon to thereby break the so far semiconducting property, vanishing the band gap, and semimetal properties can be obtained (refer to, e.g., M. Ohfuti et al., Extended Abstracts of the 1999 International Conference on Solid State Device and Materials, Tokyo, 1999, pp. 476–477). The basic structure uses this semimetal with semiconductors to fabricate the three-dimensional MOS transistor.

Here, the semimetal has properties intermediate between metal and semiconductor and has a conduction band and a valence electron band a little overlapping each other, and is a good conductor as metal. The semimetal has less free electrons than metal but has high mobility. Semimetal has high electric conductivity without doping donor impurities or acceptor impurities, which are necessary for semiconductors. Accordingly, in semimetal the electric conductivity does not lower even at low temperatures.

Figure 18:
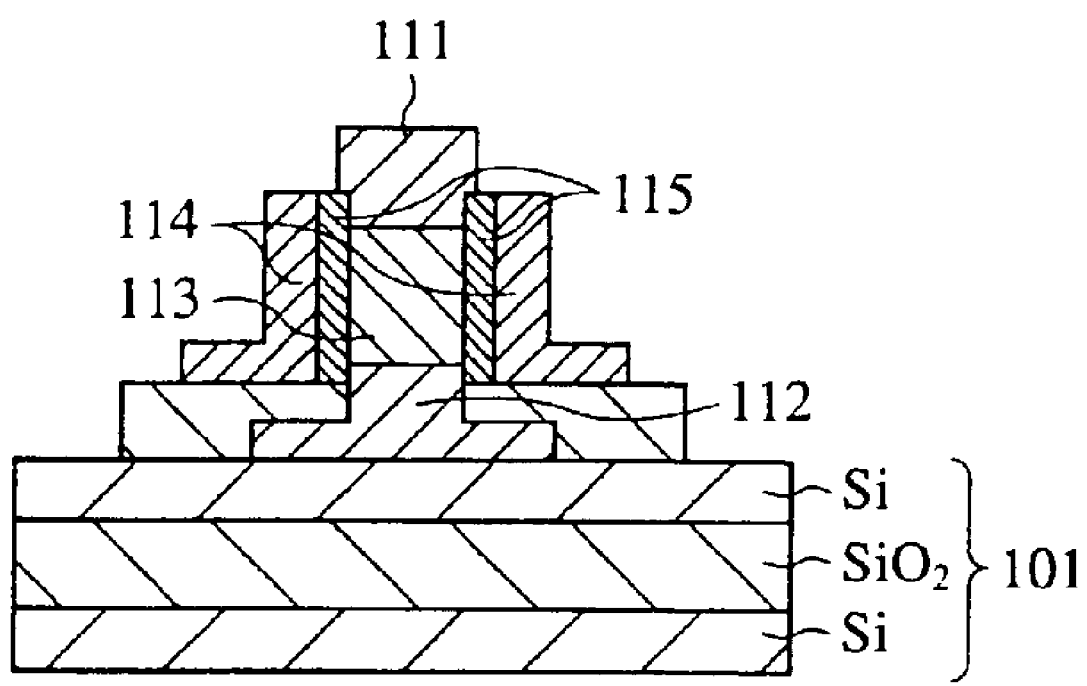
FIG. 18 is a diagrammatic sectional view of a three-dimensional MOS transistor of a semimetal/semiconductor hetero source/drain structure which is a basic structure of the present invention.

FIG. 18 is a diagrammatic sectional view of the three-dimensional MOS transistor of the semimetal semiconductor hetero source/drain structure which is the basic structure of the present embodiment.

The MOS transistor according to the present embodiment comprises a source and a drain (or either of the source and the drain) as the ohmic electrodes formed of silicon germanium carbon (SiGeC) layers 111, 112 lattice-matched with silicon or being thin sufficiently to prevent crystal defects even when a lattice constant does not agree with silicon formed above an SOI substrate of, e.g., Si—SiO$_2$—Si structure; a cylindrical channel of semiconductor/semimetal laid layers, which is formed of a silicon (Si) layer 113 sandwiched by the SiGeC layers 111, 112, the silicon (Si) layer 113 sandwiched by the SiGeC layers 111, 112, the silicon (Si) layer 113 lattice-matched with SiGeC layer 111, 112 or being thin sufficiently to prevent crystal defects even when a lattice constant does not agree with SiGeC layer 111, 112 sandwiched by the SiGeC layers 111, 112; and a surround-type gate electrode 114 surrounding the channel interposing a thin SiO$_2$ gate insulation film 115 therebetween.

The semiconductor layer may be formed of, in place of silicon (Si), silicon germanium (SiGe) or silicon germanium carbon (SiGeC) of the non-metallic composition.

The MOS transistor may have the channel in a cubic shape (or a rectangular parallelopiped shape) in place of the cylindrical shape and have the gate electrodes on both sides of the channel. The MOS transistor of both arrangements has high current-driving performance than the planar-type single gate MOS transistors suitably for short channel devices.

Figure 19A:
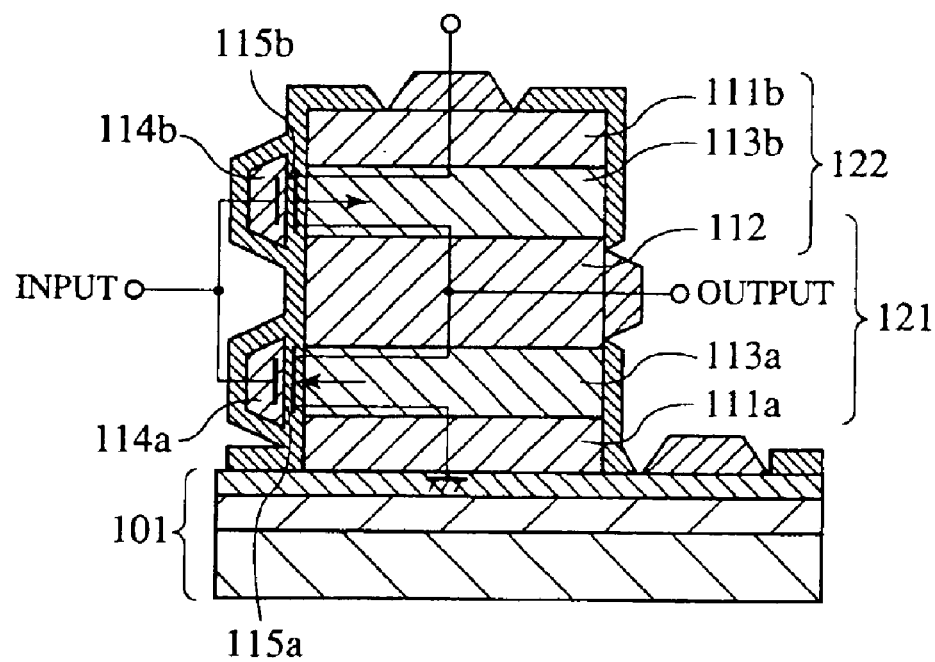
FIG. 19A is a diagrammatic view of the complementary MOS inverter circuit of a three-dimensional structure using the MOS transistors having the basic structure shown in FIG. 18 according to a sixth embodiment of the present invention.
Figure 19B:
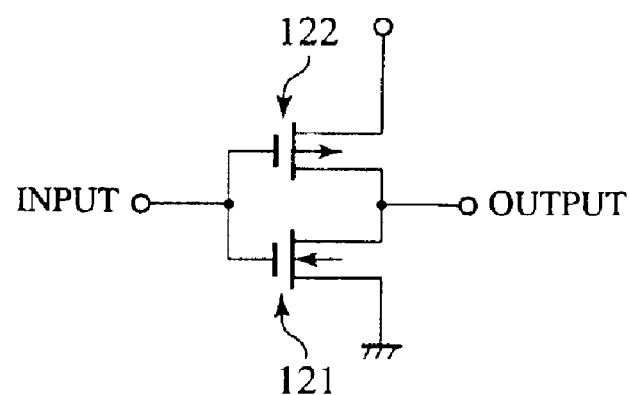
FIG. 19B is a circuit diagram of the complementary MOS inverter circuit of the three-dimensional structure shown in FIG. 19A.

In the present embodiment, a layer structure of the MOS transistor of the above-described basic structure is formed for realizing a complementary MOS inverter circuit. FIG. 19A is a diagrammatic section view of the complementary inverter circuit of a three-dimensional structure of the MOS transistors of the above-described basic structure. FIG. 19B is an equivalent circuit diagram of the complementary MOS inverter circuit shown in FIG. 19A.

The complementary MOS inverter circuit includes the basic structure of FIG. 18 laid in two states. One of the basic structures is p-MOS transistor 121 and the other of the basic structures is an n-MOS transistor 122. Both transistors are serially connected.

To be specific, the circuit according to the present embodiment comprises: a p-MOS transistor 121 as the basic structure formed on, e.g., a SOI substrate 101; an n-MOS transistor 122 as the basic structure formed on the P-MOS transistor 121. The p-MOS transistor 121 comprises: semimetallic SiGeC layers 111$a$, 112, an Si layer 113$a$ doped with an n-type impurity sandwiched by SiGeC layers 111$a$, 112, and a gate electrode 114a formed interposing a gate insulation film 115a therebetween. The SiGeC layer 111a functions as a drain, and the SiGeC layer 112 functions as a source. The n-MOS transistor 122 comprises: semi-metallic SiGeC layer 112, 113b, an Si layer 113b doped with a p-type impurity sandwiched by SiGeC layers 112, 111b, and a gate electrode 114b formed interposing a gate insulation film 115b therebetween. The SiGeC layer 111b functions as a drain, and the SiGeC layer 112 functions as a source. The transistors 121, 122 are arranged serially with the SiGeC layer 112 in common as shown in FIG. 19B. Input terminals are provided in the gate electrodes 114a, 114b, and an output terminal is provided in the SiGeC layer 112, and the complementary MOS inverter circuit which realizes the inverter function by means of a single pillar of the two layers of the basic structures is formed.

Then, effects of the three-dimensional configuration of the complementary MOS inverter circuit according to the present embodiment will be explained. Here, for the convenience of the explanation, the complementary MOS inverter circuit including three serially connected MOS transistors is exemplified.

Figure 20A:
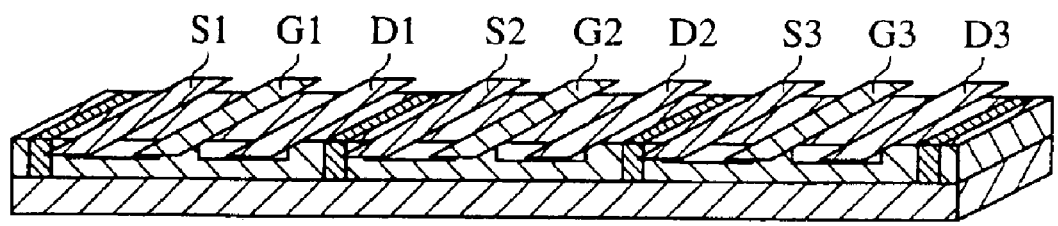
FIG. 20A is a diagrammatic view of a conventional structure of the complementary inverter circuit.
Figure 20B:
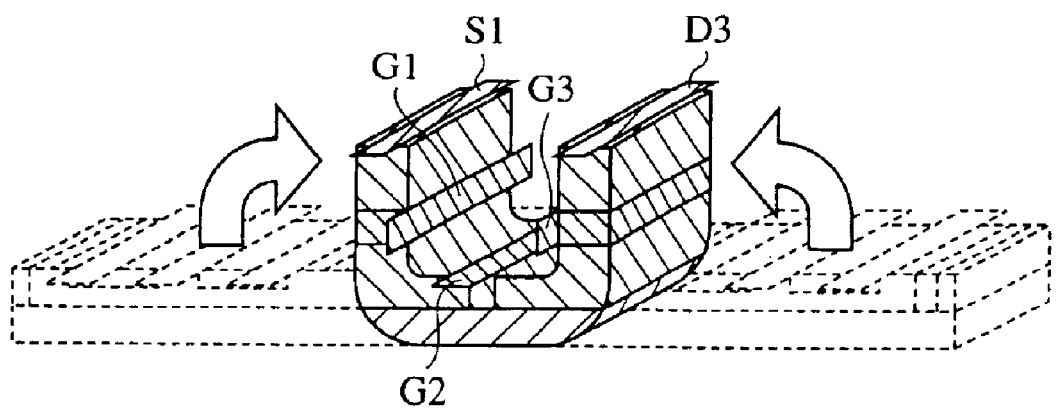
FIG. 20B is a diagrammatic views of a three-dimensional structure of the complementary MOS inverter circuit according to the sixth embodiment of the present invention, which explains effects produced by the configuration.

In planar transistors, as shown in FIG. 20A, three interconnections are necessary for the gate G, the source S and the drain D of each of the transistors. Totally 9 interconnections are provided, and, for example, D1 and S2, and D2 and S3 are respectively interconnected. In contrast to this, in the three-dimensional transistor, when the same interconnection is used as shown in FIG. 20B, the interconnections D1 and S2, and the interconnection D2 and S3 are respectively common, and the interconnections can be reduced to 5 interconnections. An occupied bottom area can be reduced to about ⅓ of the area.

Then, the method for fabricating the complementary MOS inverter circuit having the above-described structure according to the present embodiment will be explained. FIGS. 21A–21C, 22A–22C, and 23A–23C are sectional views of the complementary MOS inverter circuit in the steps of the method for fabricating the complementary MOS invert circuit, which explain the method.

Figure 21A:
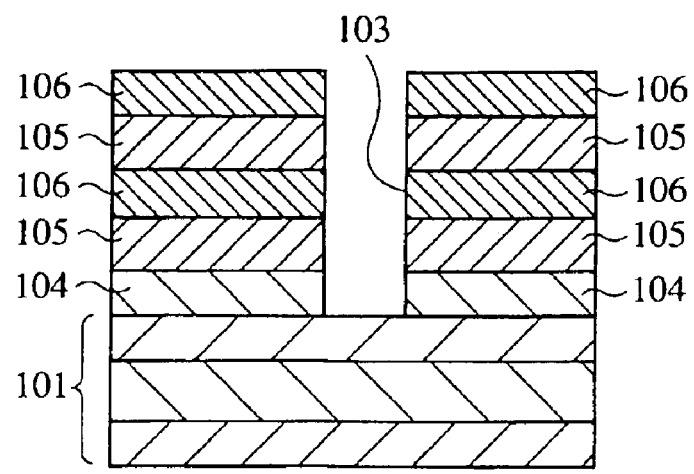
FIGS. 21A–21C, 22A–22C, and 23A–23C are diagrammatic sectional views of the complementary MOS inverter circuit according to the sixth embodiment of the present invention in the steps of the method for fabricating the same, which explain the method.

As shown in FIG. 21A, a silicon nitride film 104, a silicon oxide film 105, a silicon nitride film 106, a silicon oxide film 105 and a silicon nitride film 106 are formed sequentially one on another on an SOI substrate 101. The films laid on the SOI substrate 101 are subjected to lithography and anisotropic etching following the lithography to form a groove 103.

Figure 21B:
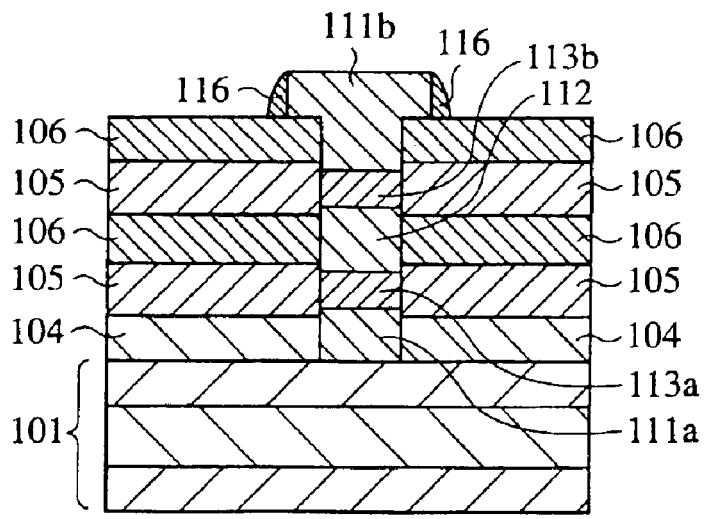
Figure 21C:
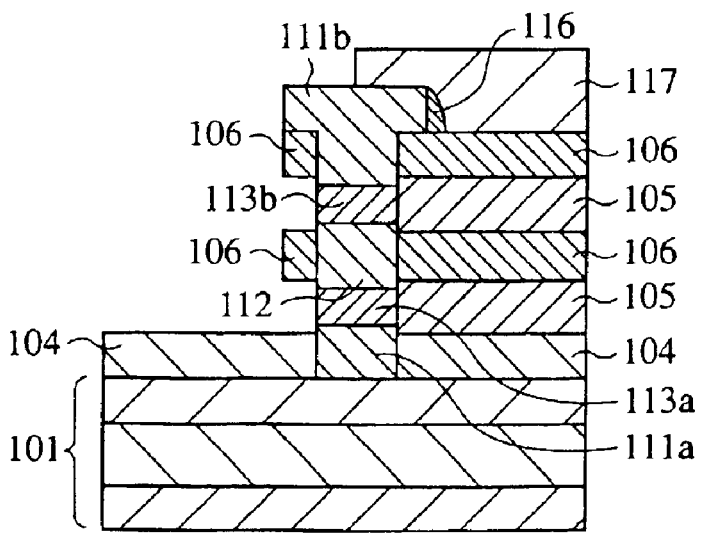

Next, as shown in FIG. 21B, an SiGeC layer 111a, an Si layer 113a doped with an n-type impurity, an SiGeC layer 112 and an Si layer 113b doped with a p-type impurity are sequentially deposited in the groove 103 by CVD method. Furthermore, an SiGeC layer 111b is deposited on the silicon nitride film 106, filling the groove 103. Next, a silicon oxide film is deposited on the entire surface and dry etched to form a sidewall 116 on the side surface of the SiGeC layer 111b.

It is preferable that in place of forming doped Si layers 113a, 113b, non-doped Si layers are respectively formed and ion-implanted with impurities. In this case, after the SiGeC layer 111a, the non-doped Si layer A, the SiGeC layer 112, the non-doped Si layer B are formed, an n-type impurity is ion-implanted at acceleration energy which allows the ions to arrive at the non-doped Si layer A, and then a p-type impurity is ion-implanted at acceleration energy which permit the ions to reach the non-doped Si layer B to form the Si layers 113a, 113b.

Next, a resist film 117 is formed, covering only one side of the SiGeC layer 111b (and the sidewall 116), and with the resist film 117 as a mask, the silicon nitride film 106 and the silicon oxide film 105 (totally 4 layers) are sequentially etched. That is, the silicon nitride film 106 is dry etched, the silicon oxide film 105 is wet etched, the silicon nitride film 106 is dry etched, and the silicon oxide film 105 is wet etched. Thus, the two silicon nitride films 106 are partially remain above the silicon nitride film 104 on the other side. In these steps, the exposed sidewall 116 is removed by the etching.

Figure 22A:
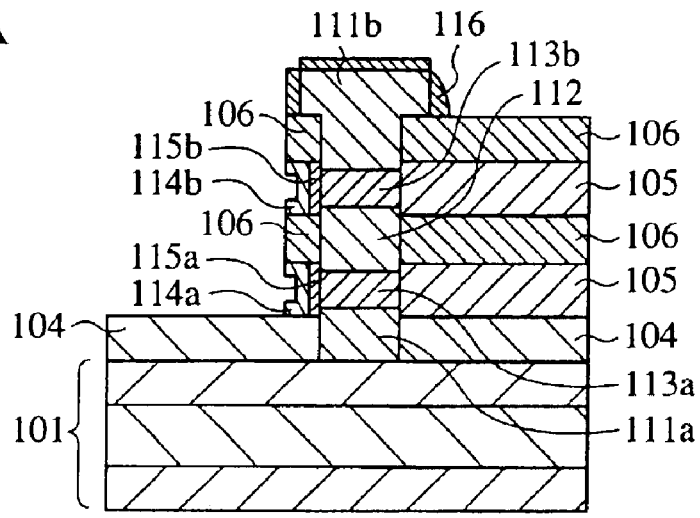

Then, as shown in FIG. 22A, after the resist film 117 is removed, thin gate insulation films 115a, 115b are formed by thermal oxidation on the side surfaces of the Si layers 113a, 113b exposed between the silicon nitride film 104 and the partially remaining silicon nitride film 106 and between the two partially remaining silicon nitride films 106. Subsequently, polycrystalline silicon is deposited by CVD method on the gate insulation films 115a, 115b, and unnecessary part of the polycrystalline silicon is dry etched off to form the gate electrodes 114a, 114b.

Figure 22B:
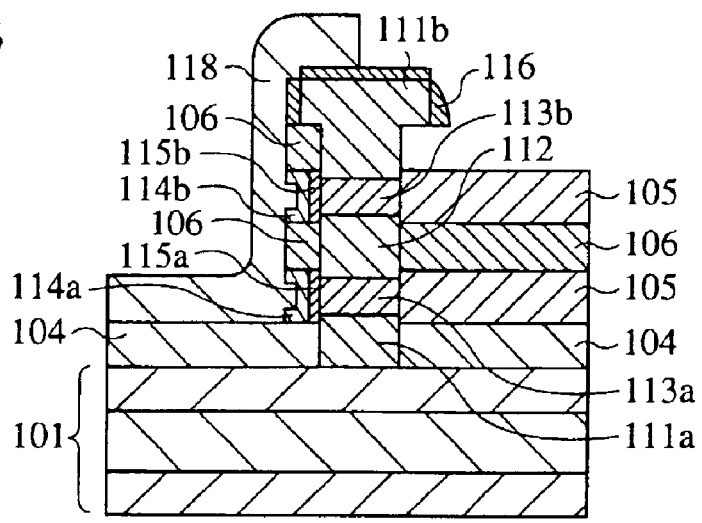

Next, as shown in FIG. 22B, a resist film 118 is formed on the other side, covering the gate electrodes 114a, 114b, and with the resist film 118 as a mask, the upper silicon nitride film 106 is removed by wet-etching.

Figure 22C:
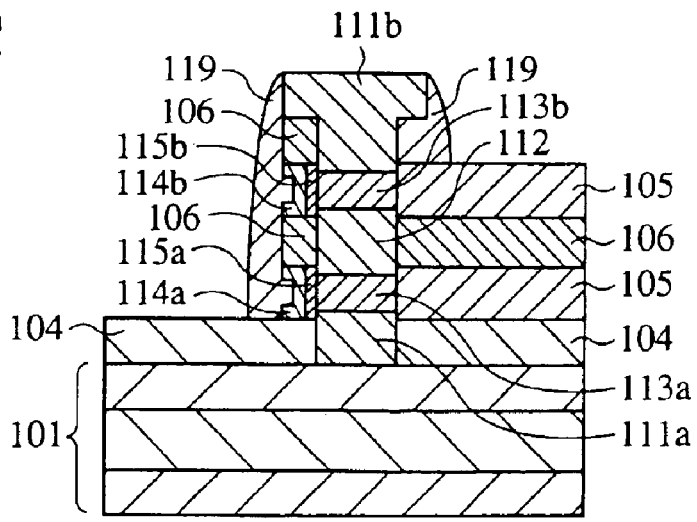

Then, as shown in FIG. 22C, after the resist film 118 is removed, a silicon oxide film is deposited on the entire surface and dry-etched to form a sidewall 119.

Figure 23A:
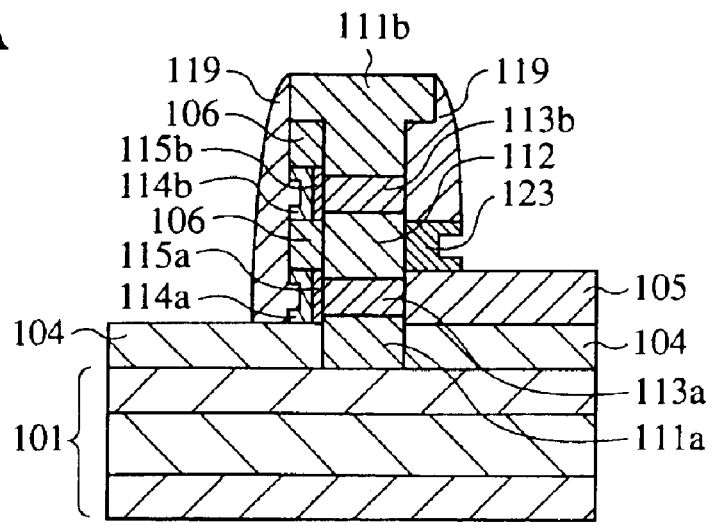

Then, as shown in FIG. 23A, with the sidewall 119 as a mask, the silicon nitride film 106 exposed on said one side is removed by wet etching. Subsequently, polycrystalline silicon is deposited by CVD, and unnecessary part of the polycrystalline silicon is removed by dry etching to form an electrode 123 at the part below the sidewall 119, where the silicon nitride film 106 has been removed.

Figure 23B:
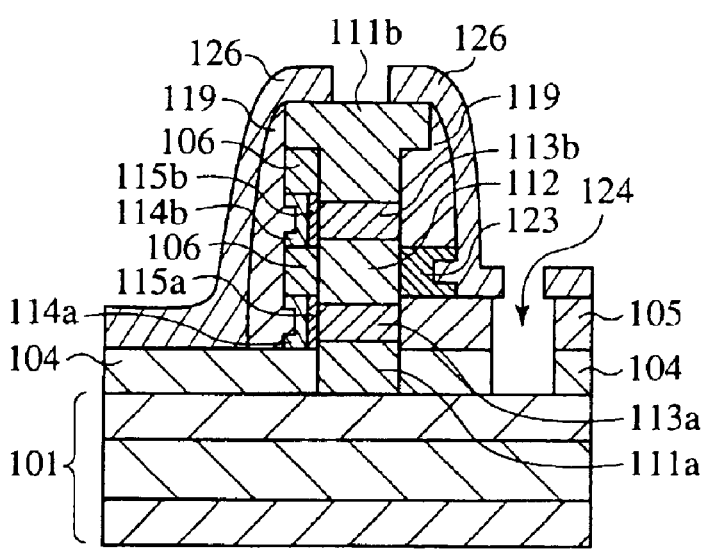

Next, as shown in FIG. 23B, a resist film 126 is formed in a pattern which is partially opened on the SiGeC layer 111b and partially on the silicon oxide film 105 near the electrode 123. With the resist film 126 as a mask, the silicon oxide film 105 and the silicon nitride film 104 are dry etched to form a window 124.

Figure 23C:
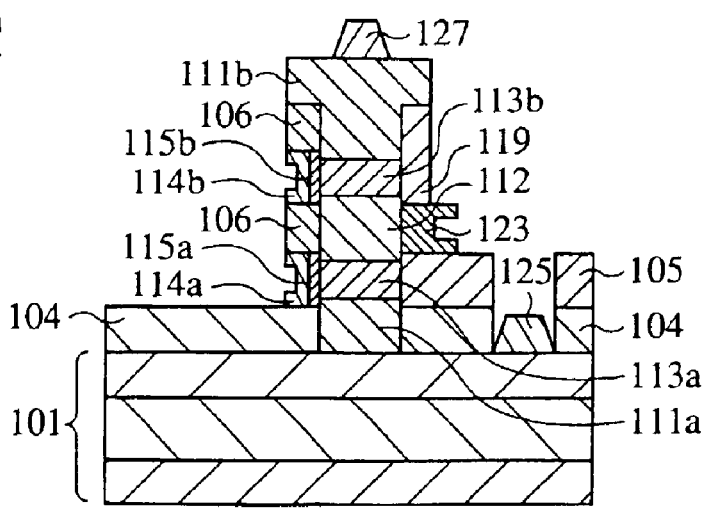

Net, as shown in FIG. 23C, a polycrystalline silicon film or ohmic metal film is evaporated on the entire surface to form, by lift-off, electrodes 125, 127 respectively in the window 114 and on the SiGeC layer 111b.

Then, the resist film 126 is removed, and required steps of forming the insulation film, etc. follow. The vertical complementary MOS inverter circuit of the three-dimensional structure is completed.

As described above, according to the present embodiment, the semiconductor-semimetal structure of the semiconductor layer sandwiched by the semimetal layers is used as the basic structure of a transistor, and the basic structure is laid one on another in two stages, whereby a three-dimensional structure complementary MOS inverter circuit whose occupied area is very small area and is substantially the same as an area of the basic structure, and has good high speed and high frequency characteristics can be realized.

Then, modifications of the present embodiment will be explained. The same members of the modifications as those of the sixth embodiment are represented by the same reference numbers not to repeat their explanation.

(Modification 1)

The semiconductor device according to Modification 1 includes MOS transistors having said basic structure laid one on another in two stages, as in the sixth embodiment, but is different from the sixth embodiment in that in the present modification, the semiconductor device has an E/D logic gate structure.

Figure 24A:
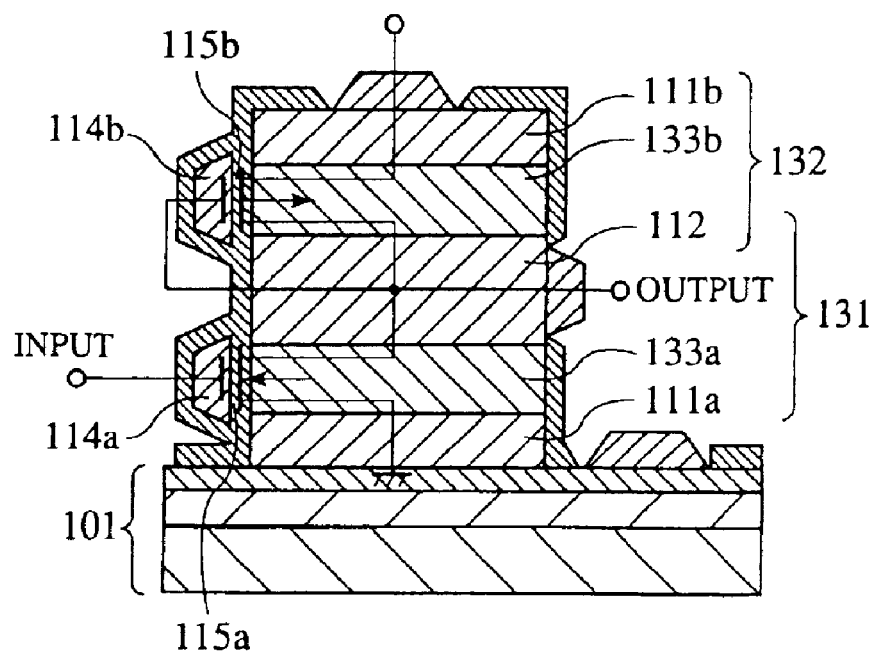
FIG. 24A is a diagrammatic view of the E/D MOS inverter circuit according to Modification 1 of the sixth embodiment of the present invention.
Figure 24B:
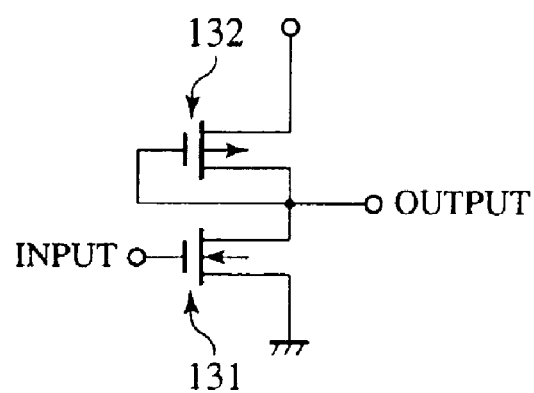
FIG. 24B is a circuit diagram of the complementary inverter circuit of the three-dimensional structure shown in FIG. 24A.

FIG. 24A is a diagrammatic sectional view of the E/D MOS inverter circuit according to the present modification. FIG. 24B is a equivalent circuit diagram of the E/D MOS inverter circuit.

A main structure of the E/D MOS inverter circuit includes the basic structure shown in FIG. 18 laid in two stages. One of the basic structures is an n-MOS transistor 131, and the other basic structure is an n-MOS transistor 132 having an n-type dopant concentration different from that of the n-MOS transistor 131. Both MOS transistors are serially connected.

To be specific, the circuit according to the present Modification comprises: a n-MOS transistor 131 as the basic structure formed on, e.g., a SOI substrate 101; an n-MOS transistor 132 as the basic structure formed on the n-MOS transistor 131. The n-MOS transistor 131 comprises: semimetallic SiGeC layers 111a, 112, an Si layer 133a doped with an p-type impurity sandwiched by SiGeC layers 111a, 112, and a gate electrode 114a formed interposing a gate insulation film 115a therebetween. The SiGeC layer 111a functions as a drain, and the SiGeC layer 112 functions as a source. The n-MOS transistor 122 comprises: semi-metallic SiGeC layer 112, 113b, an Si layer 133b doped with a p-type impurity of a concentration different from that of the Si layer 133a sandwiched by SiGeC layers 112, 111b, and a gate electrode 114b formed interposing a gate insulation film 115b therebetween. The SiGeC layer 111b functions as a drain, and the SiGeC layer 112 functions as a source. The transistors 131, 132 are arranged serially with the SiGeC layer 112 in common as shown in FIG. 24B. Input terminals are provided in the gate electrodes 114a, 114b, and an output terminal is provided in the SiGeC layer 112, and the E/D MOS inverter circuit which realizes the inverter function by means of a single pillar of the two layers of the basic structures is formed.

As described above, according to the present Modification, the semiconductor-semimetal structure of the semiconductor layer sandwiched by the semimetal layers is used as the basic structure of a transistor, and the basic structure is laid one on another in two stages, whereby the three-dimensional structure E/D MOS inverter circuit whose occupied area is very small area and is substantially the same as an area of the basic structure, and has good high speed and high frequency characteristics can be realized.

(Modification 2)

The semiconductor device according to Modification 2 of the sixth embodiment of the present invention includes two layers of MOS transistors of the basic structure as in the sixth embodiment, but is different from the sixth embodiment in that the semiconductor device according to the present modification has a vertical transmission gate structure including the two layers of MOS transistors of the basic structure are juxtaposed with each other.

Figure 25A:
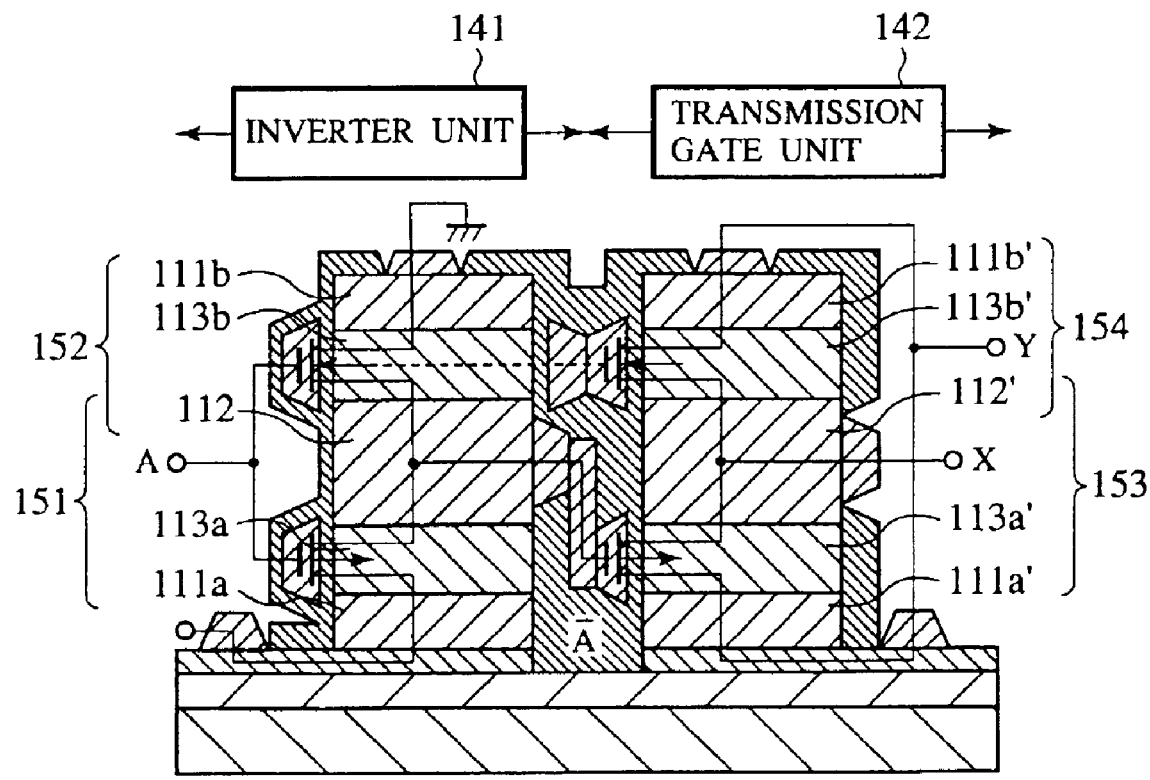
FIG. 25A is a diagrammatic view of the CMOS transmission circuit according to Modification 2 of the sixth embodiment of the present invention.
Figure 25B:
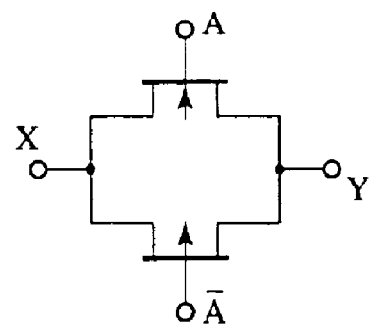
FIG. 25B is a circuit diagram of the complementary inverter circuit of the three-dimensional structure shown in FIG. 25A.

FIG. 25A is a diagrammatic sectional view of the CMOS transmission circuit of the three-dimensional structure of MOS transistors of the basic structure according to the sixth embodiment. FIG. 25B is an equivalent circuit diagram of the CMOS transmission circuit shown in FIG. 25A.

The main structure of the CMOS transmission circuit comprises: an inverter unit 141 as an input unit including the basic structures shown in FIG. 18 laid one on another in two stages, one being an n-MOS transistor 151 and the other being a p-MOS transistor 152, which are serially connected, forming an input unit; and a transmission gate unit 142 juxtaposed with the inverter 141 and including the basic structures laid one on another in two stages, one being an n-MOS transistor 153, and the other being a p-MOS transistor 154, which are serially connected, forming an output unit.

To be specific, the inverter unit 141 according to the present embodiment comprises: an n-MOS transistor 151 as the basic structure formed on, e.g., a SOI substrate 101; an p-MOS transistor 152 as the basic structure formed on the n-MOS transistor 151. The n-MOS transistor 151 comprises: semimetallic SiGeC layers 111a, 112, an Si layer 113a doped with a p-type impurity sandwiched by SiGeC layers 111a, 112, and a gate electrode 114a formed interposing a gate insulation film 115a therebetween. The SiGeC layer 111a functions as a drain, and the SiGeC layer 112 functions as a source. The P-MOS transistor 152 comprises: semimetallic SiGeC layer 112, 111b, an Si layer 113b doped with an n-type impurity sandwiched by SiGeC layers 112, 111b, and a gate electrode 114b formed interposing a gate insulation film 115b therebetween. The SiGeC layer 111b functions as a drain, and the SiGeC layer 112 functions as a source. The transistors 151, 152 are arranged serially with the SiGeC layer 112 in common as shown in FIG. 25B. Input terminal A is provided in the gate electrodes 114a, 114b, and an input terminal /A (/ indicates an inverted signal) for the transmission gate unit 142 is provided in the SiGeC layer 112. Thus, the inverter unit 141 is constituted.

Similarly, the transmission gate unit 142 according to the present embodiment comprises: an n-MOS transistor 153 as the basic structure formed on the SOI substrate 101 juxtaposed with the inverter unit 141; and an p-MOS transistor 154 as the basic structure formed on the n-MOS transistor 153. The n-MOS transistor 153 comprises: semimetallic SiGeC layers 111a', 112', an Si layer 113a' doped with a p-type impurity sandwiched by SiGeC layers 111a', 112', and a gate electrode 114a' formed interposing a gate insulation film 115a' therebetween. The SiGeC layer 111a' functions as a drain, and the SiGeC layer 112' functions as a source. The p-MOS transistor 154 comprises: semimetallic SiGeC layer 112', 111b', an Si layer 113b' doped with an n-type impurity sandwiched by SiGeC layers 112', 111b', and a gate electrode 114b' formed interposing a gate insulation film 115b' therebetween. The SiGeC layer 111b' functions as a drain, and the SiGeC layer 112' functions as a source. The transistors 153, 154 are arranged serially with the SiGeC layer 112' in common as shown in FIG. 25B. The SiGeC layer 111a' of the n-MOS transistor 153 and the SiGeC layer 111b' of the p-MOS transistor 154 are connected to each other. An output terminal X is provided in the SiGeC layer 112'. An output terminal Y is provided in the SiGeC layer 111a' (111b'). Thus, the transmission gate unit 142 is formed.

The SiGeC layer 112 of the inverter unit 141 and the gate electrode 114a' of the transmission gate unit 142 are connected to each other. The gate electrode 114b' of the inverter unit 141 is disposed on the Si layer 113b' of the transmission gate unit 142 interposing an insulation film (corresponding to a gate insulation film) therebetween. Two pillars each of the two layers of the basic structures are provided to thereby form the CMOS transmission circuit having the transmission gate function.

As described above, according to the present Modification, the semiconductor-semimetal structure of the semiconductor layer sandwiched by the semimetal layers is used as the basic structure of a transistor, and the basic structure is laid one on another in two stages, and the structure of the basic structures laid one on another in two stages is juxtaposed with each other, whereby the three-dimensional structure transmission circuit whose occupied area is very small area and is substantially the same as an area of the basic structure, and has good high speed and high frequency characteristics can be realized.

The present embodiment is not limited to the semiconductor circuits exemplified in the sixth embodiment and its modifications, and structures of the basic structures laid one on another are combined, whereby all the logic circuits, as of NOR, NAND, etc., can be formed.

[A Seventh Embodiment]

A semiconductor integrated circuit according to a seventh embodiment of the present invention will be explained with reference to FIGS. 26, 27, and 28A–28D. The present embodiment exemplifies a semiconductor integrated circuit including a plurality of semiconductor integrated structures laid one on another with inter-layer insulation films disposed therebetween. The same members of the present embodiment as those of the sixth embodiment are represented by the same reference numbers not to repeat their explanation.

Figure 26:
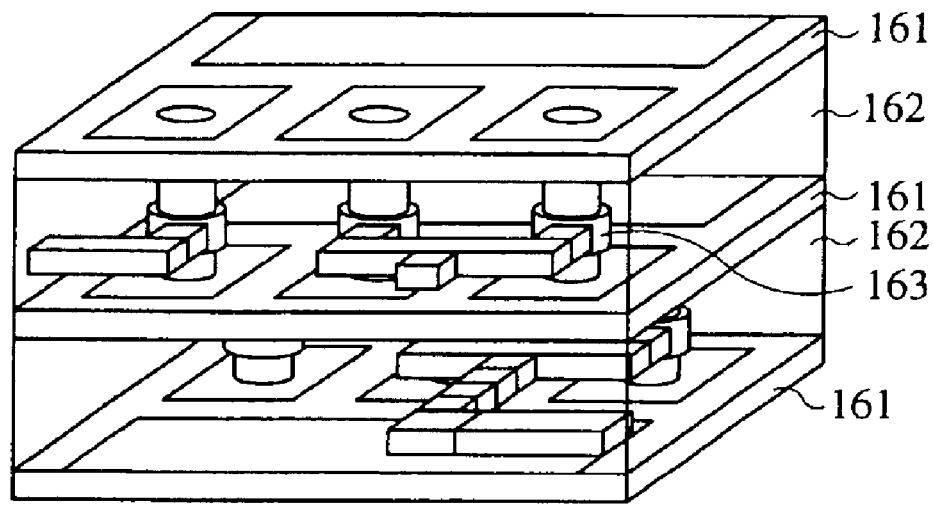
FIG. 26 is a diagrammatic perspective view of the semiconductor integrated circuit according to a seventh embodiment of the present invention.

FIG. 26 is a diagrammatic perspective view of the semiconductor integrated circuit according to the present embodiment.

In the semiconductor integrated circuit, respective LSI chips 161 formed in a semiconductor integrated structure are laid one on another with inter-layer insulation films 162 disposed therebetween and are connected to their horizontally adjacent one by vias 163 buried in the inter-layer insulation films 162.

In the present embodiment, the vias 163 are MOS transistors (active vias) having the basic structure described in the sixth embodiment, which function as switching elements.

Figure 27:
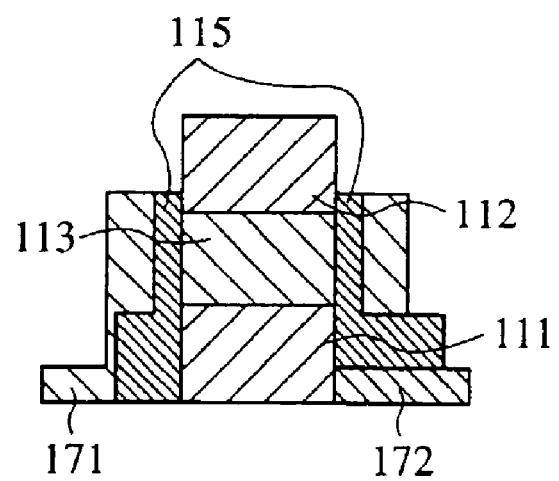
FIG. 27 is a diagrammatic sectional view of an active via which is a constituent element of the semiconductor integrated circuit according to the seventh embodiment of the present invention.

That is, as shown in FIG. 27, each via 163 comprises: a source and a drain of semimetallic SiGeC layers 111, 112; a conductor/semimetal cylindrical channel formed of the SiGeC layers 111, 112 sandwiching a silicon (Si) layer 113; an active via gate 171 surrounding the channel interposing a gate insulation film 115 of a thin $SiO_2$ film therebetween; and a lower interconnection layer 172 formed on the SiGeC layer 111 and led outside.

In using the vias 163 as switching elements, information transmission among the LSI chips 161 vertically adjacent to each other can be controlled by programs of the other LSI chips, etc. That is, relationships among the vertically adjacent LSI chips 161, etc. will provide various supply modes of on/off control signals. Preferable examples of such supply modes will be explained with reference to FIGS. 28A–28D.

Figure 28A:
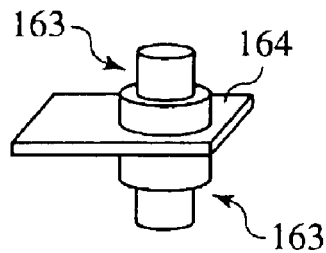
FIGS. 28A–28D are diagrammatic perspective views of various modes of supply of control signals for on/off of the active via in connection with LSI chips, etc. disposed upper and lower of the active via.

First, as shown in FIG. 28A, an intermediate layer 164 for controlling only on/off of the vias 163 which function as switching circuits is provided between required LSI chips 161 adjacent to each other. The intermediate layer 164 is sandwiched by pairs of the vias 163 with the lower interconnection layer 172 of the respective vias 163 connected to the intermediate layer 164. Various semiconductor elements for controlling the vias 163 are formed on the intermediate layer 164.

Figure 28B:
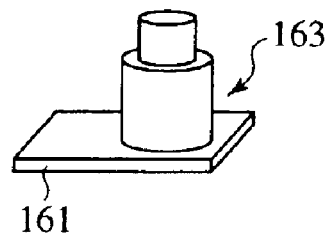

Next, as shown in FIG. 28B, the lower LSI chip 161 is used as a supply source of the control signals. That is, the via 163 is provided on the upper surface of the LSI chip 161, and the lower interconnection layer 172 of the via 163 is connected to the LSI chip 161 to thereby supply the control signals for the via 163 from the LSI chip 161.

Figure 28C:
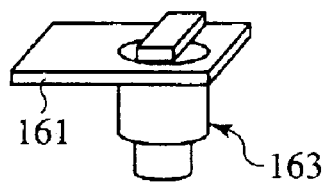

Next, as shown in FIG. 28C, the upper LSI chip 161 is used as a supply source of the control signals. That is, the via 163 is provided on the underside of the LSI chip 161, and the lower interconnection layer 172 of the via 163 is connected to the LSI chip 161 to thereby supply the control signals for the via 163 from the LSI chip 161.

Figure 28D:
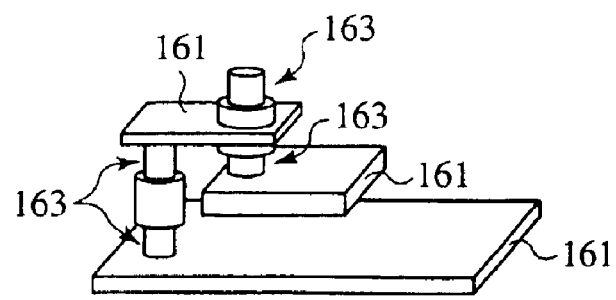

Next, as shown in FIG. 28D, for higher design freedom, the control signals may be supplied for required via 163 from an LSI chip 161 other than LSI chips 161 adjacent to each other at the top and the bottom of the via 163, i.e., an LSI chip 161 which is spaced by one or more layers of the LSI chips 161.

Such control signal supply modes are selected in accordance with architectures of semiconductor integrated circuits, whereby circuit operations of higher-level functions can be provided.

As described above, according to the present embodiment, the basic structure of the transistor is applied to the via 163 electrically interconnecting LSI chips 161, whereby the via 163 is not used as mere connection means, but as elements for realizing various active functions in addition to the connection functions the switching function here. Thus, organic interrelation among respective LSI chips can be ensured very efficiently by using a small occupied area, and design freedom can be drastically increased.

Furthermore, according to the present embodiment, when the "LSI chips" are replaced by "interconnection layers", a multi-layer interconnected structure can be obtained. The vias 163 are applicable not only as interconnections between chips, but also as multi-layer interconnections.

In the present embodiment, the vias are exemplified by active vias having the basic structure. However, the present invention is not limited to such vias. For example, various semiconductor elements having the basic structure described in the sixth embodiment laid one on another can be suitably used as the vias.

What is claimed is:

1. A semiconductor device comprising:

a channel region formed of silicon;

a source region and a drain region respectively forming junctions with the channel region; and a gate electrode formed surrounding the channel region with an insulation film interposed therebetween;

at least one of the source region and the drain region being formed of SiGeC, which lattice-matches with silicon, the source region or the drain region of SiGeC having a composition graded layer formed at the junction, the composition graded layer having a composition gradually changed from SiGeC, to silicon toward the channel region.

2. A semiconductor device according to claim 1, wherein the source region or the drain region is formed of a semi-metallic SiGeC containing carbon by above 6%.

* * * * *